(12) United States Patent
Lai et al.

(10) Patent No.: US 9,748,137 B2
(45) Date of Patent: *Aug. 29, 2017

(54) METHOD FOR VOID-FREE COBALT GAP FILL

(71) Applicant: Lam Research Corporation, Fremont, CA (US)

(72) Inventors: Chiukin Steven Lai, Sunnyvale, CA (US); Jeong-Seok Na, San Jose, CA (US); Raihan Tarafdar, Santa Clara, CA (US); Raashina Humayun, Los Altos, CA (US); Michal Danek, Cupertino, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/873,152

(22) Filed: Oct. 1, 2015

(65) Prior Publication Data

US 2016/0056077 A1 Feb. 25, 2016

Related U.S. Application Data

(63) Continuation-in-part of application No. 14/465,610, filed on Aug. 21, 2014, now Pat. No. 9,349,637.

(51) Int. Cl.
*H01L 21/44* (2006.01)
*H01L 21/768* (2006.01)
(Continued)

(52) U.S. Cl.
CPC ...... *H01L 21/76879* (2013.01); *C23C 16/045* (2013.01); *H01J 37/32357* (2013.01);
(Continued)

(58) Field of Classification Search
CPC ......... H01L 21/76879; H01L 21/76864; H01L 21/76856; H01L 21/28562
(Continued)

(56) References Cited

U.S. PATENT DOCUMENTS 4,714,520 A   12/1987   Gwozdz
4,746,375 A   5/1988    Iacovangelo
(Continued)

FOREIGN PATENT DOCUMENTS

CN   101899649 A   12/2010
CN   103125013 A   5/2013
(Continued)

OTHER PUBLICATIONS

U.S. Appl. No. 15/156,129, filed May 16, 2016, entitled "Feature Fill With Multi-Stage Nucleation Inhibition."
(Continued)

*Primary Examiner* — Anthony Ho
(74) *Attorney, Agent, or Firm* — Weaver Austin Villeneuve & Sampson LLP

(57) ABSTRACT

Provided herein are methods of depositing void-free cobalt into features with high aspect ratios. Methods involve (a) partially filling a feature with cobalt, (b) exposing the feature to a plasma generated from nitrogen-containing gas to selectively inhibit cobalt nucleation on surfaces near or at the top of the feature, optionally repeating (a) and (b), and depositing bulk cobalt into the feature by chemical vapor deposition. Methods may also involve exposing a feature including a barrier layer to a plasma generated from nitrogen-containing gas to selectively inhibit cobalt nucleation. The methods may be performed at low temperatures less than about 400° C. using cobalt-containing precursors.
(Continued)

Methods may also involve using a remote plasma source to generate the nitrogen-based plasma. Methods also involve annealing the substrate.

18 Claims, 14 Drawing Sheets

(51) Int. Cl.
    H01L 21/285    (2006.01)
    H01L 21/02     (2006.01)
    H01J 37/32     (2006.01)
    C23C 16/04     (2006.01)
    H01L 23/532    (2006.01)

(52) U.S. Cl.
    CPC .. H01J 37/32449 (2013.01); H01L 21/02247 (2013.01); H01L 21/02252 (2013.01); H01L 21/28556 (2013.01); H01L 21/28562 (2013.01); H01L 21/76843 (2013.01); H01L 21/76856 (2013.01); H01L 21/76864 (2013.01); H01L 21/76876 (2013.01); H01L 21/76873 (2013.01); H01L 23/53266 (2013.01)

(58) Field of Classification Search
    USPC .................................................. 438/653
    See application file for complete search history.

(56)  References Cited

U.S. PATENT DOCUMENTS

| | | | |
|---|---|---|---|
| 5,250,467 A | 10/1993 | Somekh et al. | |
| 5,370,739 A | 12/1994 | Foster et al. | |
| 5,391,394 A | 2/1995 | Hansen | |
| 5,407,698 A | 4/1995 | Emesh | |
| 5,489,552 A | 2/1996 | Merchant et al. | |
| 5,719,410 A | 2/1998 | Suehiro et al. | |
| 5,785,796 A | 7/1998 | Lee | |
| 5,804,249 A | 9/1998 | Sukharev et al. | |
| 5,866,483 A | 2/1999 | Shiau et al. | |
| 5,963,833 A | 10/1999 | Thakur | |
| 6,001,729 A | 12/1999 | Shinriki et al. | |
| 6,013,575 A | 1/2000 | Itoh | |
| 6,017,818 A | 1/2000 | Lu | |
| 6,034,419 A | 3/2000 | Nicholls et al. | |
| 6,037,263 A | 3/2000 | Chang | |
| 6,066,366 A | 5/2000 | Berenbaum et al. | |
| 6,100,193 A | 8/2000 | Suehiro et al. | |
| 6,107,200 A | 8/2000 | Takagi et al. | |
| 6,143,082 A | 11/2000 | McInerney et al. | |
| 6,184,158 B1 | 2/2001 | Shufflebotham et al. | |
| 6,355,558 B1 | 3/2002 | Dixit et al. | |
| 6,432,830 B1 | 8/2002 | Merry | |
| 6,503,843 B1 | 1/2003 | Xia et al. | |
| 6,566,250 B1 | 5/2003 | Tu et al. | |
| 6,696,337 B2 | 2/2004 | Asano et al. | |
| 6,861,356 B2 | 3/2005 | Matsuse et al. | |
| 6,902,763 B1 | 6/2005 | Elers et al. | |
| 6,903,016 B2 | 6/2005 | Cohen | |
| 7,005,372 B2 | 2/2006 | Levy et al. | |
| 7,141,494 B2 | 11/2006 | Lee et al. | |
| 7,355,254 B2 | 4/2008 | Datta et al. | |
| 7,501,343 B2 | 3/2009 | Byun et al. | |
| 7,501,344 B2 | 3/2009 | Byun et al. | |
| 7,655,567 B1 | 2/2010 | Gao et al. | |
| 7,691,749 B2 | 4/2010 | Levy et al. | |
| 7,858,510 B1 | 12/2010 | Banerji et al. | |
| 8,119,527 B1 | 2/2012 | Chadrashekar et al. | |
| 8,124,531 B2 | 2/2012 | Chandrashekar et al. | |
| 8,258,057 B2 | 9/2012 | Kuhn et al. | |
| 8,409,985 B2 | 4/2013 | Chan et al. | |
| 8,435,894 B2 | 5/2013 | Chandrashekar et al. | |
| 8,551,885 B2 | 10/2013 | Chen et al. | |
| 8,586,473 B1 | 11/2013 | Tanwar et al. | |
| 8,835,317 B2 | 9/2014 | Chandrashekar et al. | |
| 8,853,080 B2 | 10/2014 | Guan et al. | |
| 8,975,184 B2 | 3/2015 | Chen et al. | |
| 9,153,482 B2 | 10/2015 | Knisley et al. | |
| 9,240,347 B2 | 1/2016 | Chandrashekar et al. | |
| 9,349,637 B2 | 5/2016 | Na et al. | |
| 2001/0044041 A1 | 11/2001 | Badding et al. | |
| 2002/0037630 A1 | 3/2002 | Agarwal et al. | |
| 2002/0090811 A1 | 7/2002 | Kim et al. | |
| 2002/0132472 A1 | 9/2002 | Park | |
| 2002/0155722 A1 | 10/2002 | Satta et al. | |
| 2002/0177316 A1 | 11/2002 | Miller et al. | |
| 2003/0082902 A1 | 5/2003 | Fukui et al. | |
| 2003/0091870 A1 | 5/2003 | Bhowmik et al. | |
| 2003/0129828 A1 | 7/2003 | Cohen | |
| 2003/0190802 A1 | 10/2003 | Wang et al. | |
| 2003/0194850 A1 | 10/2003 | Lewis et al. | |
| 2004/0079632 A1 | 4/2004 | Ahmad et al. | |
| 2004/0142557 A1 | 7/2004 | Levy et al. | |
| 2004/0206267 A1 | 10/2004 | Sambasivan et al. | |
| 2004/0245091 A1 | 12/2004 | Karim et al. | |
| 2005/0031786 A1 | 2/2005 | Lee et al. | |
| 2005/0059236 A1 | 3/2005 | Nishida et al. | |
| 2005/0179141 A1 | 8/2005 | Yun et al. | |
| 2006/0075966 A1 | 4/2006 | Chen et al. | |
| 2006/0094238 A1 | 5/2006 | Levy et al. | |
| 2006/0145190 A1 | 7/2006 | Salzman et al. | |
| 2007/0099420 A1 | 5/2007 | Dominguez et al. | |
| 2007/0166989 A1 | 7/2007 | Fresco et al. | |
| 2009/0045517 A1 | 2/2009 | Sugiura et al. | |
| 2009/0053426 A1 | 2/2009 | Lu et al. | |
| 2009/0053893 A1 | 2/2009 | Khandelwal et al. | |
| 2009/0160030 A1 | 6/2009 | Tuttle | |
| 2009/0163025 A1 | 6/2009 | Humayun et al. | |
| 2009/0269507 A1 | 10/2009 | Yu et al. | |
| 2009/0315154 A1 | 12/2009 | Kirby et al. | |
| 2010/0055904 A1 | 3/2010 | Chen et al. | |
| 2010/0072623 A1 | 3/2010 | Prindle et al. | |
| 2010/0130002 A1 | 5/2010 | Dao et al. | |
| 2010/0159694 A1 | 6/2010 | Chandrashekar et al. | |
| 2010/0267230 A1 | 10/2010 | Chandrashekar et al. | |
| 2010/0267235 A1 | 10/2010 | Chen et al. | |
| 2011/0111533 A1 | 5/2011 | Varadarajan et al. | |
| 2011/0151670 A1 | 6/2011 | Lee et al. | |
| 2011/0159690 A1 | 6/2011 | Chandrashekar et al. | |
| 2011/0233778 A1 | 9/2011 | Lee et al. | |
| 2011/0236594 A1 | 9/2011 | Haverkamp et al. | |
| 2012/0009785 A1 | 1/2012 | Chandrashekar et al. | |
| 2012/0077342 A1 | 3/2012 | Gao et al. | |
| 2012/0115329 A1 | 5/2012 | Chandrashekar et al. | |
| 2012/0177845 A1 | 7/2012 | Odedra et al. | |
| 2012/0294874 A1 | 11/2012 | Macary et al. | |
| 2013/0062677 A1 | 3/2013 | Li et al. | |
| 2013/0171822 A1 | 7/2013 | Chandrashekar et al. | |
| 2013/0260555 A1 | 10/2013 | Zope et al. | |
| 2013/0302980 A1 | 11/2013 | Chandrashekar et al. | |
| 2013/0330926 A1 | 12/2013 | Chandrashekar et al. | |
| 2014/0030889 A1 | 1/2014 | Chen et al. | |
| 2014/0073135 A1 | 3/2014 | Guan et al. | |
| 2014/0106083 A1 | 4/2014 | Wu et al. | |
| 2014/0349477 A1 | 11/2014 | Chandrashekar et al. | |
| 2015/0024592 A1 | 1/2015 | Chandrashekar et al. | |
| 2015/0056803 A1 | 2/2015 | Chandrashekar et al. | |
| 2015/0221542 A1 | 8/2015 | Knisley et al. | |
| 2016/0056074 A1 | 2/2016 | Na et al. | |
| 2016/0093528 A1 | 3/2016 | Chandrashekar et al. | |
| 2016/0190008 A1 | 6/2016 | Chandrashekar et al. | |
| 2016/0343612 A1 | 11/2016 | Wang et al. | |

FOREIGN PATENT DOCUMENTS

| | | |
|---|---|---|
| JP | H2-187031 A | 7/1990 |
| JP | H4-142061 A | 5/1992 |
| JP | H5-226280 A | 9/1993 |
| JP | H07-094488 | 4/1995 |
| JP | H7-147321 A | 6/1995 |
| JP | H07-226393 | 8/1995 |
| JP | 09-022896 A | 1/1997 |
| JP | 2002-016066 A | 1/2002 |

(56) References Cited

FOREIGN PATENT DOCUMENTS

| | | |
|---|---|---|
| JP | 2007-251164 | 9/2007 |
| JP | 2008-177577 | 7/2008 |
| JP | 2010-251760 A | 11/2010 |
| JP | 2011-035366 A | 2/2011 |
| KR | 10-2001-0030488 | 4/2001 |
| KR | 10-2006-0087844 | 8/2006 |
| KR | 10-2007-0054100 | 5/2007 |
| KR | 10-2010-0067065 | 6/2010 |
| WO | WO 2013/148444 | 10/2013 |
| WO | WO 2013/148880 | 10/2013 |

OTHER PUBLICATIONS

US Notice of Allowance dated Jan. 14, 2016 issued U.S. Appl. No. 14/465,610.
US Office Action dated May 25, 2016 issued U.S. Appl. No. 14/866,621.
U.S. Appl. No. 14/465,610, filed Aug. 21, 2014, entitled "Method for Void-Free Cobalt Gap Fill."
US Notice of Allowance dated May 29, 2015 issued U.S. Appl. No. 14/171,483.
US Office Action dated Sep. 3, 2015 issued U.S. Appl. No. 14/465,610.
Hesemann et al., (2000) "The Effect of Film Thickness on Stress and Transformation Behavior in Cobalt Thin Films," *Mat. Res. Soc. Symp. Proc.*, 594:219-224.
Kakuhara, et al.,(2010) "Comparison of Lifetime Improvements in Electromigration between Ti Barrier Metal and Chemical Vapor Deposition Co Capping," *Japanese Journal of Applied Physics*, 49:04DB08, 1-5 pages.
Nogami et al., (2010) "CVD Co and its Application to Cu Damascene Interconnections," *Proceedings of the IITC, IEEE*, 3 pages.
Simone et al., (2013) "Electromigration Comparison of Selective CVD Cobalt Capping with PVD Ta(N) and CVD Cobalt Liners on 22nm-Groundrule Dual-Damascene Cu Interconnects," *Reliability Physics Symposium (IRPS), IEEE International*, p. 3F.4.1-3F.4.6; 6 pages.
Yang, et al., (Jul. 2010) "Characterization of Selectively Deposited Cobalt Capping Layers: Selectivity and Electromigration Resistance", *IEEE Electron Device Letters*, 31(7):728-730.
Yang et al., (2011) "CVD Co Capping Layers for Cu/Low-k Interconnects: Cu EM enhancement vs. Co thickness," *International Interconnect Technology Conference (IITC), IEEE International*, 3 pages.
U.S. Appl. No. 14/866,621, filed Sep. 25, 2015, entitled "Feature Inhibition."
US Notice of Allowance dated Oct. 21, 2016 issued in U.S. Appl. No. 14/866,621.
US Office Action dated Nov. 25, 2011 issued in U.S. Appl. No. 13/016,656.
US Notice of Allowance dated Jan. 9, 2012 issued in U.S. Appl. No. 13/016,656.
US Office Action, dated Jan. 15, 2015, issued in U.S. Appl. No. 13/774,350.
US Office Action, dated Oct. 8, 2015, issued in U.S. Appl. No. 13/774,350.
US Office Action, dated Jun. 2, 2016, issued in U.S. Appl. No. 13/774,350.
US Final Office Action, dated Jan. 18, 2017, issued in U.S. Appl. No. 13/774,350.
US Office Action, dated Dec. 23, 2014, issued in U.S. Appl. No. 13/851,885.
US Notice of Allowance, dated Aug. 3, 2016, issued in U.S. Appl. No. 13/851,885.
US Notice of Allowance, dated Dec. 14, 2016, issued in U.S. Appl. No. 13/851,885.
US Office Action, dated Dec. 18, 2014, issued in U.S. Appl. No. 14/502,817.
US Final Office Action, dated Jul. 17, 2015, issued in U.S. Appl. No. 14/502,817.
US Notice of Allowance, dated Sep. 25, 2015, issued in U.S. Appl. No. 14/502,817.
US Office Action, dated Sep. 2, 2016, issued in U.S. Appl. No. 14/965,806.
Korean Provisional Rejection dated Nov. 16, 2012, issued in Application No. KR 2011-0068603.
Korean Office Action dated Sep. 26, 2016, issued in Application No. KR 10-2013-0054726.
PCT International Search Report and Written Opinion, dated Jun. 28, 2013, issued in PCT/US2013/033174.
PCT International Preliminary Report on Patentability and Written Opinion, dated Oct. 9, 2014, issued in PCT/US2013/033174.
Chinese First Office Action dated Feb. 26, 2016, issued in CN 201380022648.2.
Japanese Office Action dated Jan. 24, 2017, issued in JP 2015-514160.
Taiwan Office Action and Search Report dated Nov. 22, 2016 issued in Application No. TW 102110937.
PCT International Search Report and Written Opinion, dated Jul. 26, 2013, issued in PCT/US2013/034167.
PCT International Preliminary Report on Patentability and Written Opinion, dated Oct. 9, 2014, issued in PCT/US2013/034167.
Chinese First Office Action dated Mar. 18, 2016 issued in Application No. CN 201380022693.8.
Chinese Second Office Action dated Jan. 23, 2017 issued in Application No. CN 201380022693.8.
Japanese Notification of Reasons for Rejection dated Dec. 20, 2016 issued in Application No. JP 2015-503547.
Taiwan Office Action dated Oct. 25, 2016 issued in Application No. TW 102110947.
U.S. Appl. No. 15/384,175, filed Dec. 19, 2016, Wang et al.

FIG. 1A  FIG. 1B

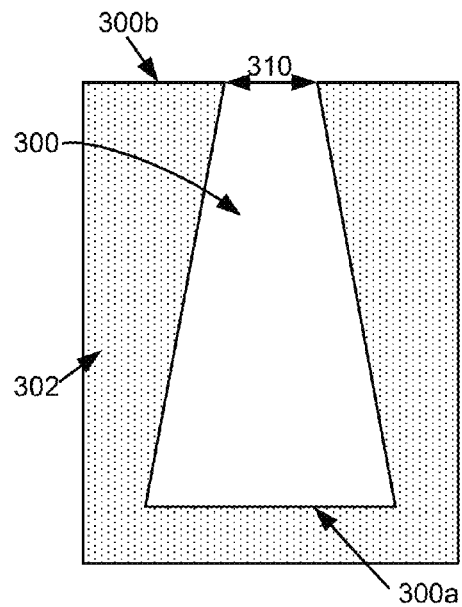
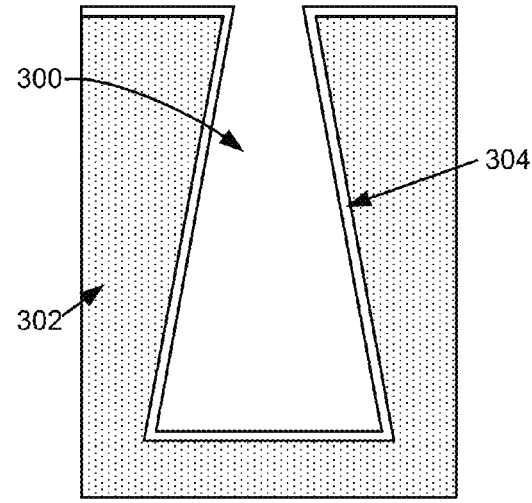
FIG. 3A        FIG. 3B
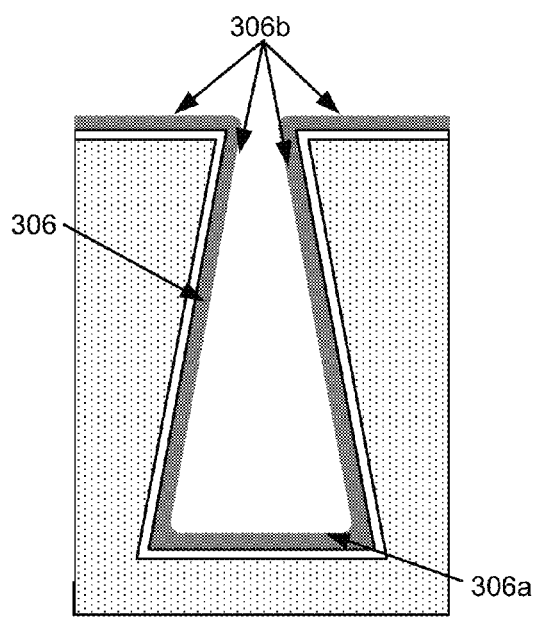
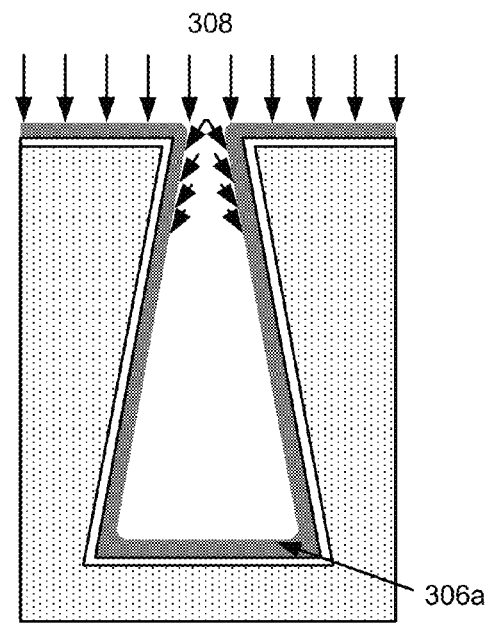
FIG. 3C        FIG. 3D

METHOD FOR VOID-FREE COBALT GAP FILL

CROSS-REFERENCE TO RELATED APPLICATION

This application is a continuation-in-part of U.S. patent application Ser. No. 14/465,610, filed Aug. 21, 2014, and titled "METHOD FOR VOID-FREE COBALT GAP FILL," which is incorporated by reference herein in its entirety and for all purposes.

BACKGROUND

Semiconductor device fabrication often involves deposition of tungsten-containing materials to be used for horizontal interconnects, vias between adjacent metal layers, and contacts between first metal layers and devices on the silicon substrate. In a conventional deposition process, tungsten is deposited in a chemical vapor deposition (CVD) process by exposing the substrate to a tungsten-containing precursor and a reducing agent.

However, as devices shrink, features become narrower and aspect ratios increase dramatically resulting in various challenges in depositing tungsten. As a result, alternative materials are sought to fill features.

SUMMARY

Provided herein are methods of depositing cobalt films. One aspect involves a method of processing a semiconductor substrates by (a) providing a substrate having one or more features, each feature including a feature opening; (b) selectively inhibiting cobalt nucleation on surfaces of the one or more features that are at or near the feature openings such that there is a differential inhibition profile in each feature; and (c) depositing cobalt in the feature in accordance with the differential inhibition profile. The method may be performed at a temperature less than about 400° C.

In some embodiments, the method further includes, prior to selectively inhibiting cobalt nucleation, depositing a barrier layer on the features. In some embodiments, the barrier layer is selected from the group consisting of titanium nitride, tungsten nitride, and cobalt nitride, and tungsten. Tungsten may be a metal-organic based tungsten, WClx-based tungsten, and other tungsten barrier.

In some embodiments, the method further includes, prior to selectively inhibiting cobalt nucleation, exposing the substrate to a cobalt-containing precursor to partially fill the one or more features.

In some embodiments, the cobalt-containing precursor is selected from the group consisting of dicarbonyl cyclopentadienyl cobalt, cobalt carbonyl, various cobalt amidinate precursors, cobalt diazadienyl complexes, cobalt amidinate/guanidinate precursors, and combinations thereof.

In various embodiments, the surfaces of the features that are at or near the feature openings include the top about 10% to about 50% of the feature sidewalls. In some embodiments, selectively inhibiting cobalt nucleation further includes exposing the substrate to plasma generated from nitrogen-containing gas. The substrate may be exposed to the plasma generated from the nitrogen-containing gas for a time less than about 300 seconds. In some embodiments, the plasma is directional.

In various embodiments, the features include re-entrant profiles. In some embodiments, depositing cobalt in (c) includes exposing the substrate to a cobalt-containing precursor and a reducing agent. In some embodiments, (c) is performed by chemical vapor deposition, or atomic layer deposition, or a combination thereof. The feature opening may be less than about 3×nm and the feature may include an aspect ratio of at least about 1.5:1. In some embodiments, for logic devices, the critical dimension may have an opening less than about 6×nm with an aspect ratio of between about 5:1 and about 15:1. For memory devices, aspect ratios may be between about 5:1 and about 100:1.

Another aspect involves a method of processing a semiconductor substrate by (a) providing a substrate including one or more features, each feature including a feature opening; (b) exposing the substrate to a cobalt-containing precursor to partially fill the features; (c) exposing the substrate to a nitrogen-containing gas and a plasma; (d) optionally repeating (b) and (c); and (e) depositing cobalt in the feature in accordance with the differential inhibition profile. In some embodiments, the method is performed at a temperature less than about 400° C.

In some embodiments, the cobalt-containing precursor is selected from the group consisting of dicarbonyl cyclopentadienyl cobalt, cobalt carbonyl, various cobalt amidinate precursors, cobalt diazadienyl complexes, cobalt amidinate/guanidinate precursors, and combinations thereof.

In various embodiments, the surfaces of the features that are at or near the feature openings include the top about 10% to about 50% of the feature sidewalls.

Another aspect involves an apparatus for processing semiconductor substrates including one or more process chambers; one or more gas inlets into the process chambers and associated flow-control hardware; a directional plasma generator; and a controller having at least one processor and a memory, such that the at least one processor and the memory are communicatively connected with one another, the at least one processor is at least operatively connected with the flow-control hardware and plasma generator, and the memory stores computer-executable instructions for: (a) introducing a cobalt-containing precursor and reducing agent to the chamber, (b) igniting the plasma and introducing a nitrogen-containing gas to the chamber, (c) optionally repeating (a) and (b), and (d) introducing the cobalt-containing precursor and the reducing agent to the chamber to form a cobalt film, where the substrates include features having re-entrant profiles. In some embodiments, the plasma power is between about 50 W and about 5000 W.

Another aspect involves a method of processing a semiconductor substrates by (a) providing a substrate having one or more features, each feature including a feature opening; (b) selectively inhibiting cobalt nucleation on surfaces of the one or more features that are at or near the feature openings such that there is a differential inhibition profile in each feature; and (c) exposing the substrate to a cobalt-containing precursor to partially fill the one or more features, whereby selectively inhibiting cobalt nucleation further includes exposing the substrate to plasma generated from a nitrogen-containing gas in a remote plasma source.

The method may further include depositing cobalt in the one or more features in accordance with the differential inhibition profile. The method may further include repeating (b) and (c) in two or more cycles to deposit cobalt into the one or more features. In some embodiments, (b) and (c) are performed at a temperature less than about 400° C.

The method may further include annealing the substrate after partially filling the one or more features. The method may further include annealing the substrate after partially filling the one or more features, wherein the substrate is annealed after each of the two or more cycles.

In some embodiments, the annealing is performed when an amount of cobalt deposited in at least one of the one or more features is between about 20% and about 60% of the at least one of the one or more features. The substrate may be annealed at a temperature between about 250° C. and about 500° C.

In some embodiments, the method also includes after annealing the substrate, electroplating copper onto the substrate or performing electroless plating of copper onto the substrate. The cobalt may be deposited by chemical vapor deposition or by atomic layer deposition or a combination thereof. The cobalt may be deposited by electroplating or electroless plating. In some embodiments, the feature opening is less than about 6×nm and the feature aspect ratio is between about 5:1 and about 100:1.

Another aspect involves an apparatus for processing semiconductor substrates including one or more process chambers; one or more gas inlets into the process chambers and associated flow-control hardware; a remote plasma generator; and a controller having at least one processor and a memory, whereby the at least one processor and the memory are communicatively connected with one another, the at least one processor is at least operatively connected with the flow-control hardware and plasma generator, and the memory stores computer-executable instructions for: (a) introducing a cobalt-containing precursor and reducing agent to the chamber, (b) introducing a nitrogen-based plasma to the chamber, the nitrogen-based plasma generated by flowing a nitrogen-containing gas to the remote plasma generator and igniting a plasma, (c) repeating (a) and (b), and (d) heating the substrate to a temperature between about 250° C. and about 500° C., whereby the substrates comprise features having re-entrant profiles.

These and other aspects are described further below with reference to the drawings.

BRIEF DESCRIPTION OF THE DRAWINGS

FIGS. 1A-1C are schematic illustrations of cobalt fill in features.

FIGS. 3A-3G are schematic illustrations of features filled with cobalt in accordance with disclosed embodiments.

DETAILED DESCRIPTION

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

In semiconductor fabrication, features may be filled with conductive materials. For example, tungsten is often filled in features to form contacts, such as in front end of line (FEOL) applications.

However, as devices shrink, aspect ratios increase and smaller features are used to form contacts. In many applications, an alternative conductive material, such as cobalt, may be used to form contacts or otherwise fill features.

Conventional cobalt deposition in semiconductor fabrication includes wet deposition processes such as electroplating and electroless plating. In cobalt electroplating, some thickness of the metal is first deposited in the feature such that the metal is sufficiently conductive, which permits a current to allow growth of the metal in the feature in the electroplating or electroless plating process. Such seed layers may have a certain maximum resistance. Wet-based cobalt feature fill processes such as electroplating typically involve feature fill in a different tool than the deposition of the seed layer, increasing the complexity of the process and the manufacturing cost.

Cobalt may also be deposited by atomic layer deposition (ALD) or chemical vapor deposition (CVD). In conventional ALD or CVD, voids may form in the features due to the feature profile. FIG. 1A is a schematic illustration of an example of such a feature 100 in a substrate 102. The substrate may be a silicon wafer, e.g., 200-mm wafer, 300-mm wafer, 450-mm wafer, including wafers having one or more layers of material such as dielectric, conducting, or semi-conducting material deposited thereon. Features can be characterized by one or more of narrow and/or re-entrant openings, constrictions within the feature, and high aspect ratios. In some embodiments, the feature 100 may have an aspect ratio of at least about 2:1, at least about 10:1, at least about 15:1, at least about 20:1 or higher. The feature hole as shown may also have a dimension near the opening, e.g., an opening diameter or line width, or opening width, or critical dimension, of less than about 19 nm, also known as feature widths less than 1×nm. The feature 100 can be referred to as an unfilled feature or simply a feature. The feature, and any feature, may be characterized in part by an axis that extends through the length of the feature, with vertically-oriented features having vertical axes and horizontally-oriented features having horizontal axes.

Figure 1C:
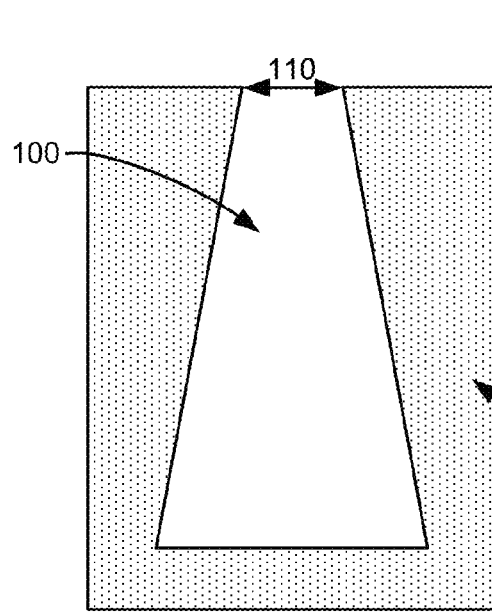
Figure 1C:
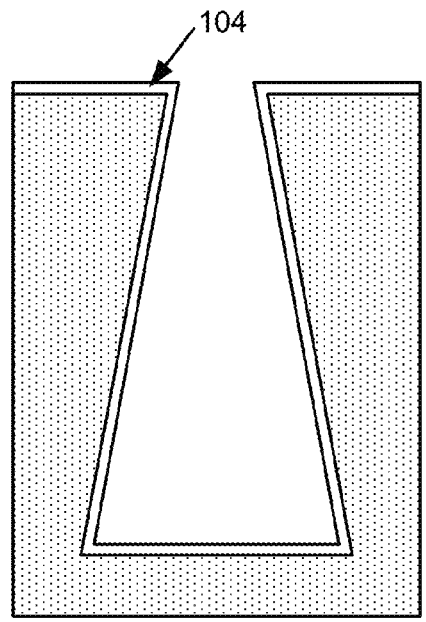
Figure 1C:
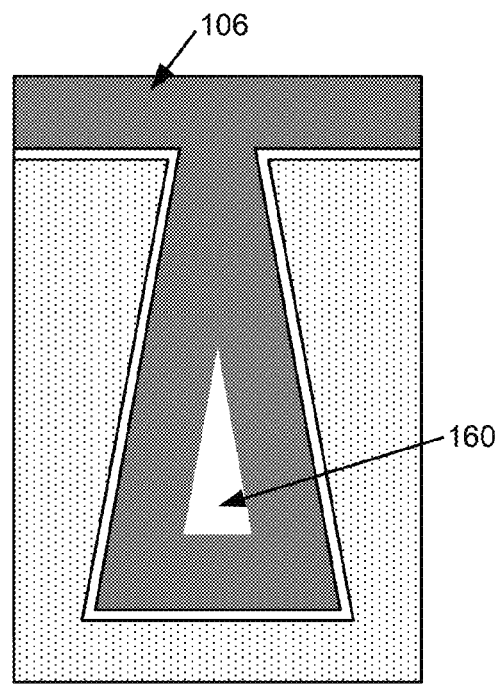

As shown, the substrate 102 includes a feature 100 having a feature opening 110 which is narrower than the width of the bottom of the feature. The feature 100 in FIG. 1A includes a re-entrant profile. A re-entrant profile is a profile that narrows from a bottom, closed end, or interior of the feature to the feature opening. According to various embodiments, the profile may narrow gradually and/or include an overhang at the feature opening. The re-entrant pattern shown in FIG. 1A may be generated by asymmetric etching kinetics during patterning and/or the overhang due to non-conformal film step coverage in the previous film deposition, such as deposition of a diffusion barrier. In various examples, the feature may have a width smaller in the opening at the top of the feature than the width of the bottom of the feature. FIG. 1B is a schematic illustration of a barrier layer 104 deposited conformally into the feature 100. After a barrier layer 104 is deposited, conventional deposition of cobalt by ALD or CVD forms a conformal cobalt film in the feature 100. FIG. 1C is a schematic illustration of the feature 100 filled with cobalt 106 by conventional ALD or CVD methods. Due to the conformal step coverage, the cobalt film 106 has a pinch-off in the re-entrant pattern entrance and results in the formation of a void 160 within the pattern of the feature 100. The cobalt pinch-off may occur on the re-entrant pattern even prior to cobalt gap fill, thereby closing the feature 100 and forming a void 160. A void is a region in the feature that is left unfilled. A void can form, for example, when the deposited material forms a pinch point within the feature, sealing off an unfilled space within the feature preventing reactant entry and deposition. The formation of voids in features often results in device failure.

Provided herein are methods of depositing void-free cobalt in both small and large features, including features having a large aspect ratio, performed by a passivation treatment. The approaches described herein are applicable to narrowly patterned substrates with re-entrant structures and/or overhangs that may occur from a prior film deposition or etching. The methods involve using a treatment to selectively inhibit cobalt film growth in some aspects of the cobalt surface to shape the cobalt film growth profile based on cobalt film growth kinetics for treated and non-treated cobalt surfaces. Treated surfaces exhibit longer nucleation delays, which allow growth from untreated surfaces in a bottom-up fill process. Such methods may be applicable to the fabrication of metal gate/contact fill in front end of line (FEOL) processes as well as via/line fill in back end of line (BEOL) processes. Overall, deposition techniques described herein result in void-free cobalt-filled features.

Methods include filling features using a single treatment, or using multiple cycles of treatment. A single treatment method may be used for smaller features, such as features having an opening on the order of less than about 3×nm or less than about 1×nm (e.g., less than about 19 nm) wide. In various embodiments, a single treatment method is used to deposit cobalt in features having an aspect ratio of at least about 1.5:1 or more, or about 10:1 or more. A multiple treatment method may be used for larger features, such as those having an opening on the order of more than about 2×nm, 3×nm, or 4×nm. In multiple treatments, each cycle decreases the remaining opening of the feature until the last cycle. Embodiments are disclosed with respect to the drawings. In some embodiments, for logic devices, the critical dimension may have an opening less than about 6×nm with an aspect ratio of between about 5:1 and about 15:1. For memory devices, aspect ratios may be between about 5:1 and about 100:1.

Figure 2A:
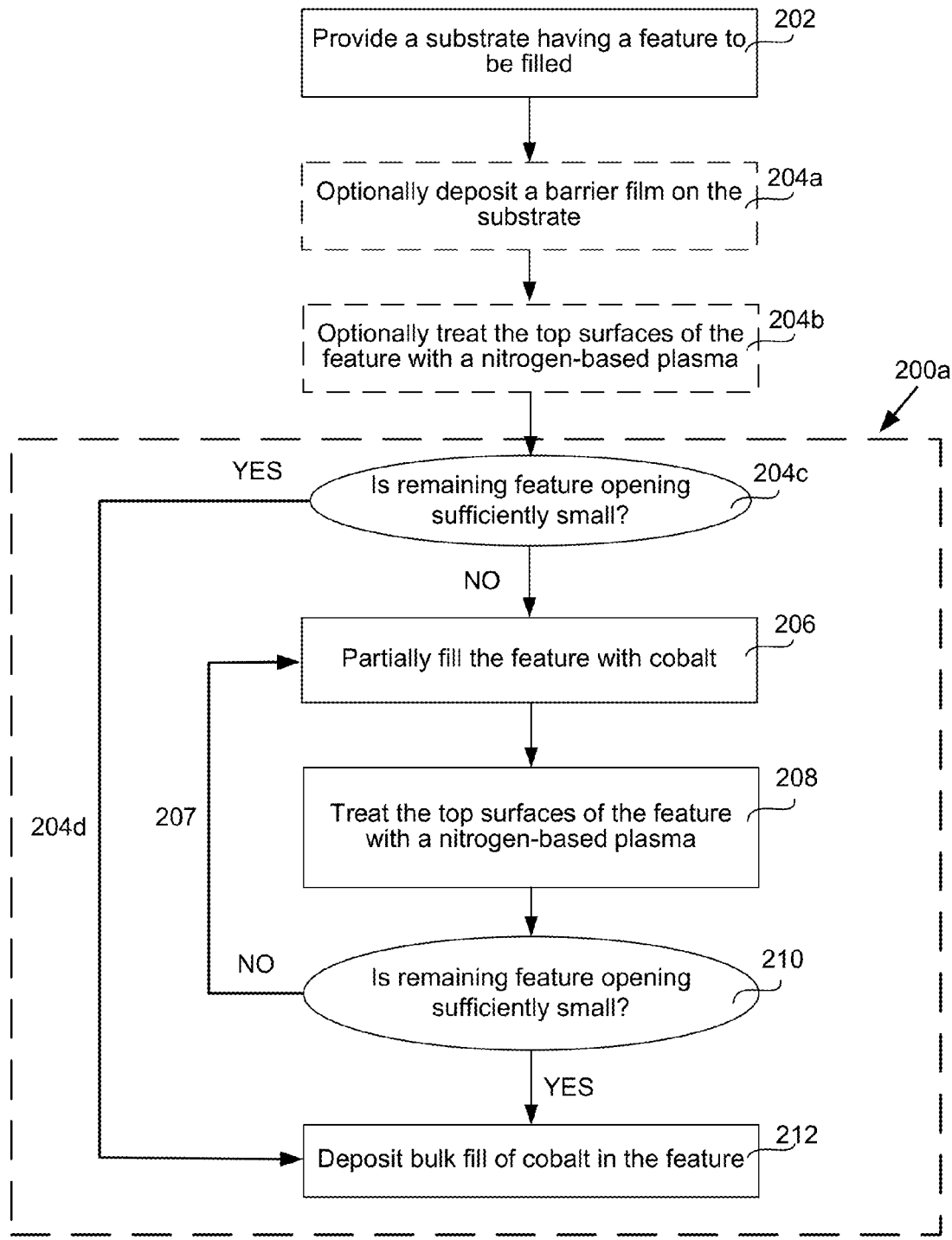
FIG. 2A is a process flow diagram depicting a method in accordance with disclosed embodiments.

FIG. 2A is a process flow diagram of operations for performing methods in accordance with disclosed embodiments. In operation 202, a substrate having a feature to be filled is provided. The substrate may be a silicon substrate or another suitable semiconductor substrate. The substrate may include more than one feature, and may include a pattern of features having features of various sizes, or features of one size. For purposes of this description, FIG. 2A is discussed in the context of filling a single feature, but it should be understood that features of various sizes may also be filled similarly. Features may be any of those described above.

FIG. 3A provides an example of a small feature 300 in a substrate 302. The small feature 300 includes a narrow feature opening 310 at the top 300b of the small feature 300, which is narrower than the bottom 300a of the small feature 300.

In operation 204a, a barrier film or barrier layer is optionally deposited on the substrate. In various embodiments, the barrier film is deposited conformally. The barrier film may be a thin layer of tungsten nitride (WN), titanium nitride (TiN), tungsten-containing barrier films, or any other suitable barrier film. Additional examples of barrier films include tungsten (W), titanium (Ti), tantalum (Ta), tantalum nitride (TaN), cobalt nitride (CoN), and ruthenium (Ru). In some embodiments, a tungsten-containing barrier film is deposited by a metal-organic precursor, or a chlorine-containing precursor (such as $WCl_x$). In various embodiments, the barrier film is deposited by ALD or CVD methods. The barrier film may be selected such that the barrier film material and cobalt form a strong, high adhesion energy interface. FIG. 3B provides an example of a barrier film 304 deposited in a small feature 300. As shown, the barrier film 304 is deposited conformally in the feature, forming a thin barrier on the substrate 302 along the contours of the feature 300.

In some embodiments, after 204a, the barrier film may be optionally treated with a nitrogen-based plasma in operation 204b. The treatment may be performed to inhibit nucleation cobalt in subsequent operations. For example, the treatment is performed to inhibit bulk cobalt fill in operation 212. In some embodiments, the treatment inhibits bulk cobalt fill in operation 206. Treatment process conditions are further described below with respect to operation 208. In some embodiments, the barrier film is treated if the feature opening is on the order of about 1×nm or smaller.

After operation 204b, in some embodiments, operations in 200a may be performed. In some embodiments, operations in 200b of FIG. 2B may be performed.

Operations of 200a are now described with respect to FIG. 2A. In operation 204c, it is determined whether the remaining feature opening is sufficiently small. In embodiments having feature openings less than about 1 nm, after a barrier film is deposited in operation 204a and the surface is treated in 204b, the feature opening may be sufficiently small. Considerations for determining whether a feature opening is sufficiently small are described below with respect to operation 210. Generally, if a feature opening is so small that depositing a cobalt seed layer into the feature would narrow the feature opening and prevent or reduce bulk cobalt fill processes, the feature opening is sufficiently small to directly deposit bulk cobalt into the feature in operation 212, as further described below. If the feature is not sufficiently small, then operation 206 is performed.

In operation 206, the feature is partially filled with cobalt at low temperature. In various embodiments, this partial fill may be referred to as a "seed layer." The feature is partially filled by exposing the substrate to a cobalt-containing precursor and a reducing agent. Operation 206 may be performed thermally such that no plasma is generated or introduced to the chamber while cobalt is deposited.

Cobalt may be deposited conformally in the feature by ALD or CVD methods. In a CVD method, the substrate is exposed to a suitable cobalt-containing precursor and a reducing agent to form a cobalt layer on the substrate. The temperature may be between about 70° C. and about 400° C., or between about 80° C. and about 200° C. In some embodiments, the temperature may be between about 70° C. and about 200° C., or between about 100° C. and about 120° C. The chamber pressure may be about 0.1 Torr to about 10 Torr, or between about 1 Torr and about 5 Torr. In some embodiments, the chamber pressure may be between about 0.5 Torr and about 10 Torr, or between about 1 Torr and about 3 Torr. In various embodiments, the suitable cobalt-containing precursor and/or reducing agent are introduced into the chamber using a carrier gas, such as argon (Ar), nitrogen ($N_2$), or carbon monoxide (CO). In some embodiments, the cobalt-containing precursor is introduced to the chamber using argon as a carrier gas. The flow rate of the carrier gas may be between about 10 sccm and about 300 sccm, or between about 10 sccm and about 50 sccm. In some embodiments, the flow rate of the carrier gas may be between about 10 sccm and about 100 sccm, or between about 10 sccm and about 30 sccm. The reducing agent may be any suitable reactant for reducing the selected cobalt-containing precursor. In various embodiments, the reducing agent is hydrogen ($H_2$). The reducing agent may be introduced at a flow rate between about 100 sccm and about 5000 sccm, or between about 2000 sccm and about 5000 sccm. It will be understood that, depending on the particular deposition chamber, flow rates outside of the ranges provided throughout this disclosure may be used.

In an ALD method, the substrate may be exposed in cycles such that the substrate is first exposed to a pulse of a suitable cobalt-containing precursor, then the precursor is purged, then the substrate is exposed to a pulse of a reducing agent, and then the reducing agent is purged, and such cycles may be repeated until a desired thickness of cobalt is formed on the substrate. For a deposition process by ALD, the temperature may be between about 70° C. and about 400° C., or between about 100° C. and about 200° C. In some embodiments, the temperature may be between about 70° C. and about 200° C., or between about 100° C. and about 120° C. The pressure may be between about 1 Torr and about 20 Torr, or between about 8 Torr and about 15 Torr. In various embodiments, the cobalt-containing precursor and/or reducing agent are introduced into the chamber using a carrier gas, such as Ar, $N_2$, or CO. In some embodiments, the cobalt-containing precursor is introduced to the chamber using Ar as a carrier gas. The flow rate of the carrier gas may be between about 10 sccm and about 300 sccm, or between about 10 sccm and about 100 sccm. In some embodiments, the flow rate of the carrier gas may be between about 50 sccm and about 100 sccm. The reducing agent may be any suitable reactant for reducing the selected cobalt-containing precursor. In various embodiments, the reducing agent is $H_2$. The reducing agent may be introduced at a flow rate between about 100 sccm and about 5000 sccm, or between about 2000 sccm and about 5000 sccm. The time when operation 206 is terminated depends on the size of the feature.

Example cobalt-containing precursors include dicarbonyl cyclopentadienyl cobalt (I), cobalt carbonyl, various cobalt amidinate precursors, cobalt diazadienyl complexes, cobalt amidinate/guanidinate precursors, and combinations thereof. Suitable cobalt-containing precursors may include a cobalt center with organic groups and/or carbonyl groups, where organic groups include alkyls, such as methyl, ethyl, propyl, butyl, pentyl, hexyl, heptyl, and octyl, which may be straight or branched hydrocarbon chains. In some embodiments, the organometallic compound has a substituted or unsubstituted allyl ligand. In some embodiments, the allyl ligand is unsubstituted.

In some embodiments the organometallic cobalt compound has the following structure:

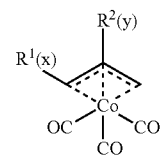

I where $R^1$ is $C_1$-$C_8$-alkyl, $R^2$ is $C_1$-$C_8$ alkyl, x is zero, 1 or 2; and y is zero or 1.

In some embodiments $R^1$ is a $C_2$-$C_8$-alkyl, $R^2$ is independently $C_2$-$C_8$ alkyl.

The term "alkyl" as used herein refers to saturated hydrocarbon chain of 1 to 8 atoms in length, such as methyl, ethyl, propyl, butyl, pentyl, hexyl, heptyl, and octyl. The term "alkyl" includes both straight and branched hydrocarbon chains. Thus, the term propyl includes both n-propyl and isopropyl. The term butyl includes n-butyl, sec-butyl, isobutyl, and tert-butyl.

In some embodiments x is 0 and y is 1. An example of an organometallic compound in accordance with this embodiment is shown below:

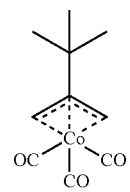

II

Certain described compounds are available from SAFC-Hitech of Haverhill, Mass., in conjunction with corresponding deposition apparatuses available from Lam Research Inc., of Fremont, Calif.

In some embodiments, cobalt-containing precursors include metal-organic precursors having a high vapor pressure at low temperatures, such as at temperatures less than about 100° C. An example vapor pressure may be about 0.5 Torr in an about 30° C. environment. Such precursors are highly selective such that later cobalt deposition is selective to non-treated versus treated surfaces, which are described in detail below. For example, the cobalt-containing precursor may have growth selectivity to generate sufficient nucleation delay on treated surfaces compared to untreated surfaces as described below. For example, the nucleation delay may be greater than about 200 seconds.

FIG. 3C is a schematic illustration of a cobalt seed layer 306 partially filled in small feature 300 over the barrier layer 304. Note that the cobalt seed layer 306 is also conformal. The small feature 300 is partially filled such that fill of the feature 300 is terminated when the opening at the top of the feature is sufficiently small to allow some plasma to enter in subsequent processing, and is small enough to prevent plasma from entering into the majority of the sidewalls in the feature. The remaining opening at the top of the feature is prepared to allow plasma to enter in subsequent processing, but to limit plasma exposure to the top about 10-30% of the sidewalls of the deposited cobalt indicated by 306b, which is discussed in detail below.

If the feature is a large feature, such as a feature having an initial opening greater than about 3×nm, or greater than about 1×nm, then the partial fill is stopped at a predetermined time even if the remaining opening on the feature is not small enough to prevent plasma from entering into the majority of the sidewalls in the feature.

Figure 4A:
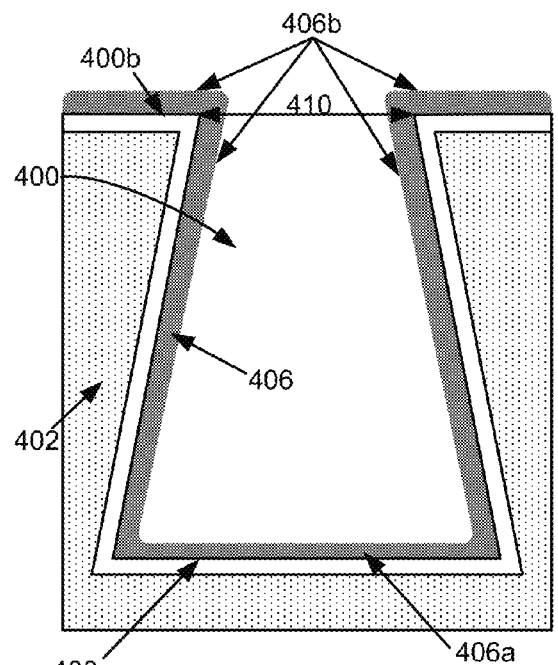
FIGS. 4A-4H are schematic illustrations of features filled with cobalt in accordance with disclosed embodiments.

FIG. 4A is a schematic illustration of an example of a large feature 400 in a substrate 402. The large feature 400 has a feature opening 410, which may be on the order of greater than about about 2×nm or about 3×nm. The large feature 400 includes an optional barrier film which was deposited conformally in accordance with operation 204a described above with respect to FIG. 2A. A cobalt seed layer 406 is deposited conformally over the substrate per operation 206 with respect to FIG. 2A, and the predetermined time for terminating cobalt seed layer deposition depends on the feature size.

Returning to FIG. 2A, in operation 208, the cobalt surfaces at and near the top of the feature are treated by exposing to a plasma generated from a nitrogen-containing gas. This treatment may be referred to as "inhibitor controlled exposure" (ICE) or "plasma-based surface nitridation." In some embodiments, a remote plasma is used to generate the plasma. In various embodiments, the plasma is a directional plasma such that the active species from the plasma directly contact the surfaces of the feature in a direction perpendicular to the plane of the substrate. In some embodiments, treated surfaces may form cobalt nitride ($CoN_x$), which triggers a long nucleation delay in subsequent processing. A treated barrier film, such as one from treated in operation 204b may have a nucleation delay shorter than the nucleation delay on a treated cobalt film. The following description describes treated cobalt surfaces but it should be understood that any of the following treatment processes and conditions may be used to treat barrier films and form treated barrier film, such as in operation 204b.

Since various features may have an opening narrower than the width of the bottom of the feature, the plasma treats mostly the top surfaces of the feature and the top about 10% to about 50% of the feature sidewalls. In some embodiments, the plasma treats the top about 10% to about 30% of the feature sidewalls. In various embodiments involving a small feature, due to the narrow opening, the bottom about 50% to 90% of the sidewalls remains untreated. In some embodiments, the bottom about 70% to 90% of the sidewalls remains untreated. In some embodiments, when the active species hits the feature opening, nitrogen ions collide around the opening, leaving a small gradient of treated cobalt surfaces near the top of the feature. Since treated surfaces exhibit a longer nucleation delay, cobalt nucleation is selectively inhibited on the treated surfaces such that there is a differential inhibition profile along a feature axis formed by the treatment. Selective inhibition, which may also be referred to as selective passivation, differential inhibition, or differential passivation, involves inhibiting subsequent cobalt nucleation on a portion of the feature, while not inhibiting nucleation (or inhibiting nucleation to a lesser extent) on the remainder of the feature. For example, in some embodiments, a feature is selectively inhibited at or near a feature opening (e.g., the top about 10% to about 50%, or about 10% to about 30% of the feature sidewalls and the top surfaces of the feature), while nucleation in the bottom about 70% to 90%, or about 50% to 90% of the sidewalls inside the feature is not inhibited.

FIG. 3D is a schematic illustration of nitrogen ions 308 generated from plasma directed at the surfaces of the deposited cobalt 306. Note that the surfaces of cobalt at the top of the feature 306b are exposed to the nitrogen ions 308, while the surfaces of cobalt at the bottom of the feature 306a are not exposed to nitrogen ions. This is due to the narrower opening at the top of the feature 300, such that the nitrogen ions hit the top about 10-50% of the sidewalls, forming a differential inhibition profile of treated cobalt surfaces 306b. Note that the arrows on the sidewalls are depicted to show the collision of nitrogen ions around the opening of the feature.

A directional plasma may generate ions, neutral species, and radicals among other species that form the differential inhibition profile. For a directional plasma, ions generated may be the dominant species in the inhibition process.

In some embodiments, a remote plasma may be used. A remote plasma may generate ions in addition to neutral species and radicals as well as other species. However, as compared to a directional in-situ plasma, a remote plasma may generate little to no ions, and the dominant species in the inhibition process may be radicals, rather than ions. In various embodiments, a remote plasma may be more gentle such that damage to components of the substrate is reduced (e.g., there is little bombardment of plasma species onto the substrate). This may be used in particular when fabricating logic devices, which may be more susceptible to performance issues if damaged by an in-situ or directional plasma. Damage caused by plasma may reduce functionality of the device. For example, for fabrication of a transistor, plasma damage to components of the transistor, such as in the metal gate area, may result in a voltage shift or electrical inefficiency.

Where a remote plasma is used, the substrate temperature may be set to a temperature between about 30° C. and about 450° C. In various embodiments, the chamber pressure may be set at a pressure between about 0.001 Torr and about 10 Torr. The RF power may be between about 50 W and 10000 W. In various embodiments, a nitrogen-containing gas is flowed to the remote plasma generator to generate a nitrogen-based plasma. The nitrogen-containing gas may be any of those described above. In some embodiments, the nitrogen-containing gas is nitrogen ($N_2$). The nitrogen flow rate may be between about 5 sccm and about 10000 sccm. The substrate may be exposed to a nitrogen-based plasma generated from a remote plasma generator for a duration between about 1 second and about 200 seconds.

In embodiments where a large feature is filled with cobalt, the nitrogen ions enter the entire feature and may treat some of the bottom of the feature and bottom portions of the sidewalls. However, due to the shape of the feature, the top portion of the feature sidewalls may be treated with more nitrogen ions than the bottom sidewalls of the feature.

Figure 3E:
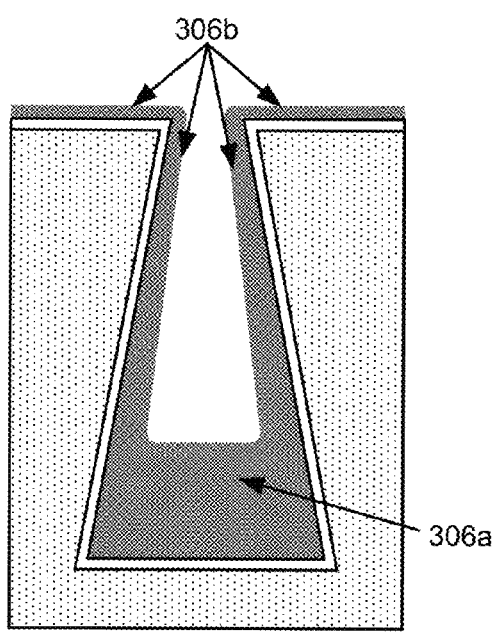
Figure 4B:
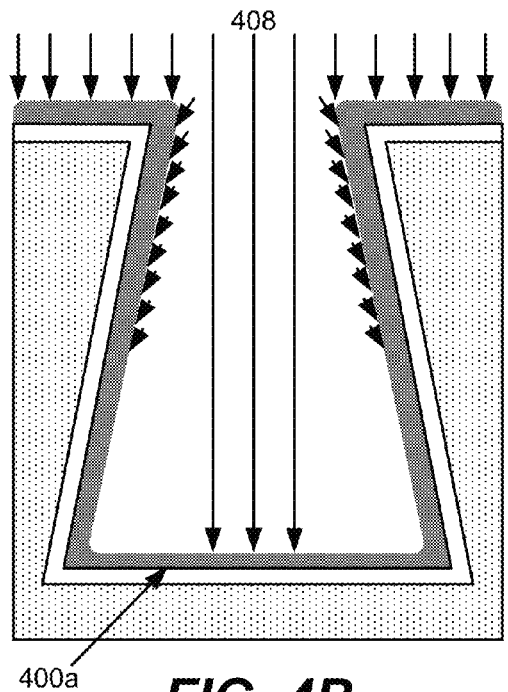

FIG. 4B is a schematic illustration of a larger feature 400 with a cobalt seed layer 406 exposed to a plasma and nitrogen ions 408. Note that as compared to FIG. 3D, the bottom of the feature 400a is also exposed to the plasma due to the wider opening. However, since the surface is further away from the plasma 408, the surface at the bottom 400a may not be exposed to as much plasma 408 as the surfaces at the sidewalls and the top of the feature.

The treatment performed in operation 208 may be performed at a temperature less than about 400° C., or between about 50° C. and about 200° C., or between about 70° C. and about 200° C. The chamber pressure may be less than about 10 Torr, or between about 0.1 Torr and about 5 Torr, or between about 0.5 Torr and about 2 Torr. The plasma used may be a directional in-situ plasma with a bias. Typically though not necessarily, such a plasma is capacitivelycoupled. Alternatively, it may be inductively-coupled. The plasma power for a single station may be between about 50 W and about 5000 W, or 100 W and about 1000 W, or between about 100 W and about 500 W, or between about 200 W and about 500 W. The gas introduced to the chamber for generating the plasma may be any nitrogen-containing gas or mixture of nitrogen-containing gases. In various embodiments, the gas used is nitrogen. The gas flow rate may be between about 50 sccm and about 5000 sccm, or between about 100 sccm and about 2000 sccm, or between about 100 sccm and about 500 sccm, or between about 200 sccm and about 500 sccm. Operation 208 may be performed for an exposure time less than about 300 seconds, or between about 1 second and about 300 seconds, or between about 5 seconds and about 60 seconds. In some embodiments, exposure time may be between about 2 seconds and about 60 seconds, or between about 5 seconds and about 20 seconds. In some embodiments, operation 208 is performed before operation 206. In some embodiments, operation 206 is performed before operation 208.

Returning to FIG. 2A, if in operation 210, it is determined that the remaining feature opening is not sufficiently small (e.g., if the feature being filled is a large feature having a feature opening greater than 3×nm, for example), such that the bottom of the feature was exposed to plasma in operation 208, or the opening of the feature is not sufficiently narrowed such that only the top 10-50% of the sidewalls of cobalt are treated in operation 208, then the operations 206 and 208 may be repeated as shown in operation 207 until a sufficient thickness of partially filled cobalt seed layer is formed in the substrate.

Figure 4C:
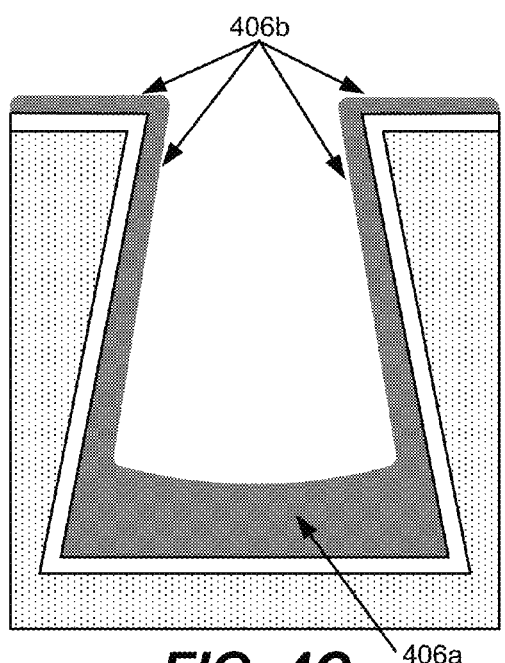
Figure 4D:
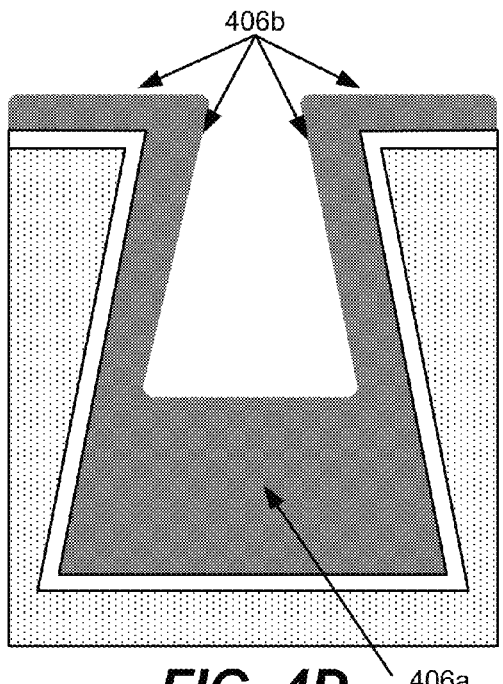

FIGS. 4C-4H are schematic illustrations of depositing a large feature with cobalt by repeating operations 206 and 208 over time. In FIG. 4C, cobalt is introduced to the chamber to continue to form cobalt. Note, however, that although more cobalt is formed at the bottom of the feature at 406a, since much of the cobalt surface was treated, there is also cobalt growth at 406b. The nucleation delay experienced at 406b may not be much higher than the little to no nucleation delay at 406a. In FIG. 4D, cobalt is further deposited such that cobalt around the top of the feature 406b is growing at the same or similar rate as the cobalt at the bottom of the feature 406a. FIGS. 4C and 4D depict growth of cobalt over time while operation 206 is performed to partially fill the feature with cobalt at low temperature again. Any of the above conditions and methods described with respect to operation 206 may be used to perform the repeated operation.

Figure 4E:
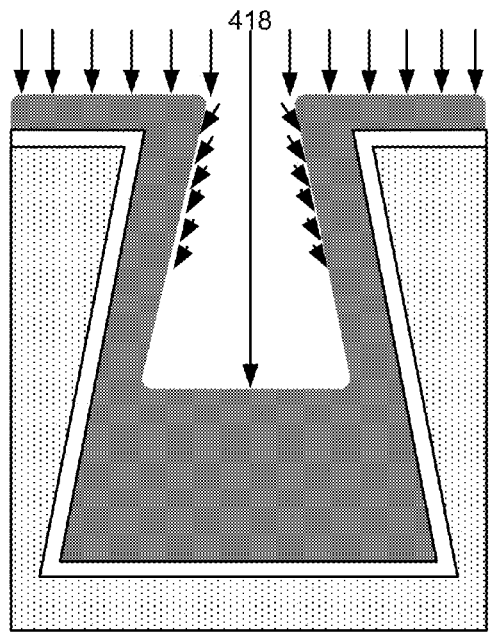

After a predetermined time, the top surfaces of the feature 406b are treated in operation 208 by exposing the substrate to a plasma generated from a nitrogen-containing gas. FIG. 4E show a schematic illustration of the subsequent treatment. Note that the nitrogen ions 418 now primarily treat the top surfaces 406b of the feature, much like the illustration in FIG. 3D. This ensures that subsequent deposition using the cobalt-containing precursor will be selective and nucleation delay on the treated surfaces will be higher than the nucleation delay on the untreated surfaces.

Returning to FIG. 2A, in operation 210, the remaining opening (e.g., the remaining space between the deposited cobalt films at the top of the feature) is evaluated. If the remaining opening is sufficiently small such that the bottom of the feature was not exposed to the plasma during operation 208, then bulk fill of cobalt is deposited into the feature per operation 212. In some embodiments, this is performed using CVD cobalt gap fill methods. The substrate is exposed to a cobalt-containing precursor and a reducing agent to form cobalt on the surface of deposited cobalt. In some embodiments, operation 212 involves electroplating cobalt onto the substrate. In some embodiments, overburden on the feature may be deposited to a thickness between about 200 nm and about 400 nm.

For CVD deposition of cobalt gap fill, the temperature may be between about 70° C. and about 400° C., or between about 70° C. and about 200° C. In some embodiments, the temperature may be between about 70° C. and about 200° C., or between about 70° C. and about 90° C. The chamber pressure may be between about 0.1 Torr and about 10 Torr, or between about 1 Torr and about 5 Torr. In some embodiments, the pressure may be between about 0.5 Torr and about 10 Torr, or between about 1 Torr and about 3 Torr. The cobalt-containing precursor and/or reducing agent may be introduced using a carrier gas, such as Ar, $N_2$, or CO, which may have a flow rate between about 10 sccm and about 300 sccm or between about 10 sccm and about 50 sccm. In some embodiments, the flow rate is between about 10 sccm and about 100 sccm, or between about 10 sccm and about 30 sccm. In some embodiments, the cobalt-containing precursor and/or reducing agent are introduced with Ar as a carrier gas. The reducing agent may be $H_2$, flowing at a flow rate between about 100 sccm and about 5000 sccm, or between about 2000 sccm and about 5000 sccm. The process time and thickness of operation 210 depends on the size of the feature.

Figure 3F:
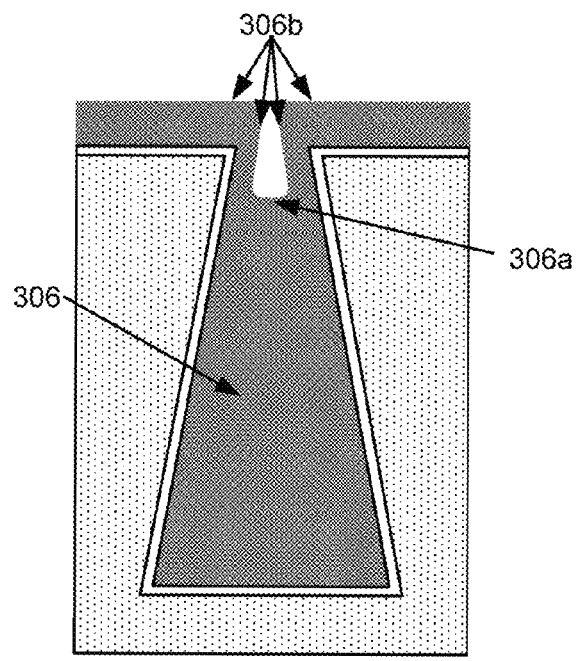
Figure 3G:
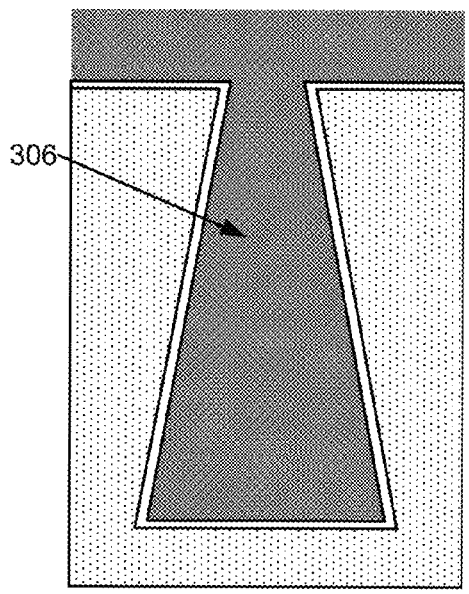

FIGS. 3E-3G show schematic illustrations of the gap fill process over time in a small feature. In FIG. 3E, it was determined in operation 210 that the remaining opening was sufficiently small, and operations 206 and 208 were not repeated. Bulk cobalt fill was subsequently deposited per operation 212. As shown, in FIG. 3E, since the top surfaces 306b were treated, these surfaces are passivated such that when cobalt is deposited on the substrate, these surfaces have a longer nucleation delay than compared to the bottom surfaces that were not treated. The nucleation delay for a treated surface may be greater than about 200 seconds. The time of nucleation for a non-treated surface versus a treated surface depends on the treatment exposure time. The time of nucleation can be evaluated by comparing the thickness of cobalt on a non-treated surface versus a treated surface over time. For example, treated surfaces may have a nucleation delay such that over about 300 seconds, the non-treated surfaces may have about 17 to 18 nm more cobalt deposited than the treated surfaces for a treatment exposure time of about 20 seconds. Void-free gap cobalt gap fill is made possible by high selective film growth between treated and non-treated cobalt layers. Thus, the growth of cobalt in FIG. 3E is mostly bottom up such that cobalt deposited at the bottom of the feature 306a continues to grow. In FIG. 3F, note that the surfaces at 306b have nucleated by the time the cobalt at 306a has filled most of the feature. In FIG. 3G, the cobalt fill is complete such that the feature is filled with void-free cobalt 306.

Figure 4F:
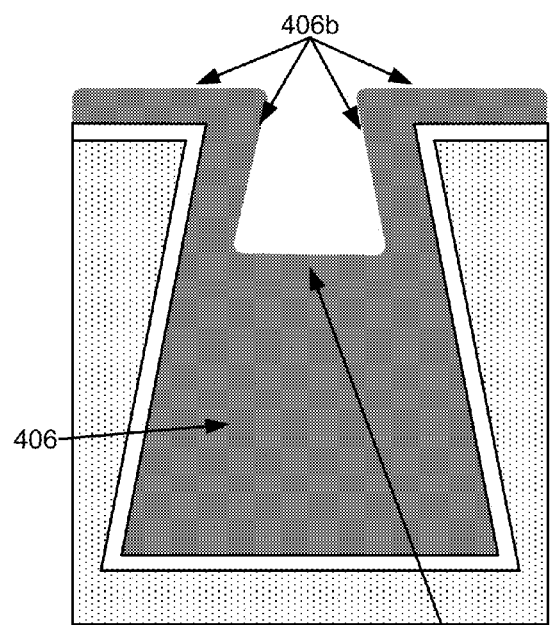
Figure 4G:
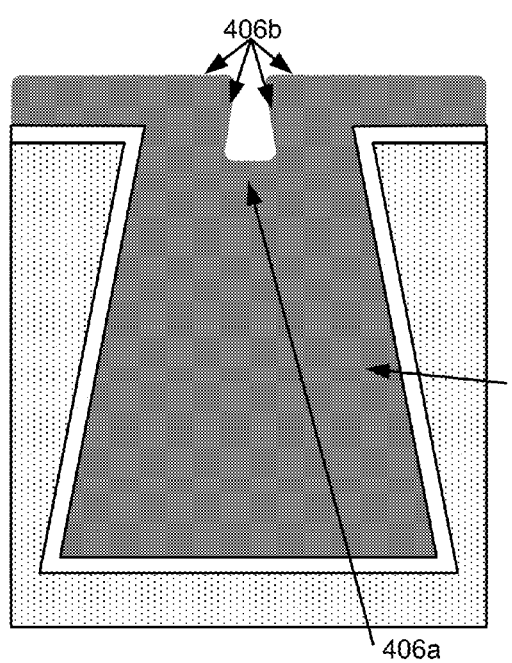
Figure 4H:
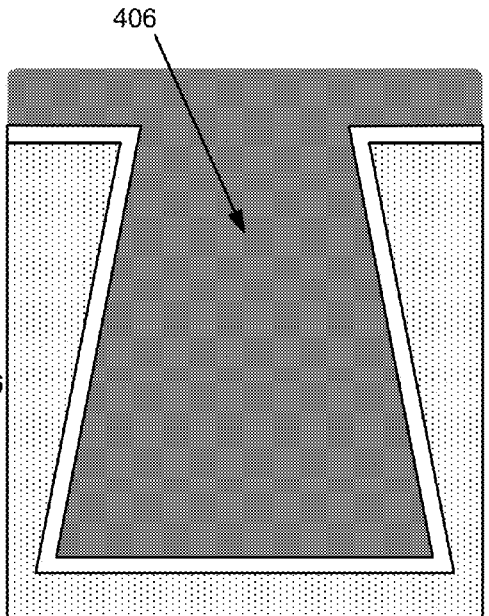

In FIG. 4F, it is determined in operation 210, after repeating operations 206 and 208 as described above, that the remaining opening is sufficiently small. Operation 212 is performed such that CVD cobalt gap fill occurs. As described, in some embodiments, such as if the feature opening is very small, after the barrier film is treated in operation 204b, a bulk cobalt layer is deposited in operation 212 without deposition of a cobalt seed layer. Nonetheless, as shown in FIG. 4F, as bulk cobalt is deposited, the surfaces at the top 406b have a higher nucleation delay and therefore little growth is shown, while growth of bulk cobalt 406 is shown at the bottom surface of the cobalt 406a. In FIG. 4G, cobalt nucleates at the top of the feature 406b, but the bottom surface of the cobalt 406a has already filled most of the feature. FIG. 4H provides a schematic illustration of the void-free cobalt 406 deposited in a large feature using cycles of treatment and deposition.

Figure 2B:
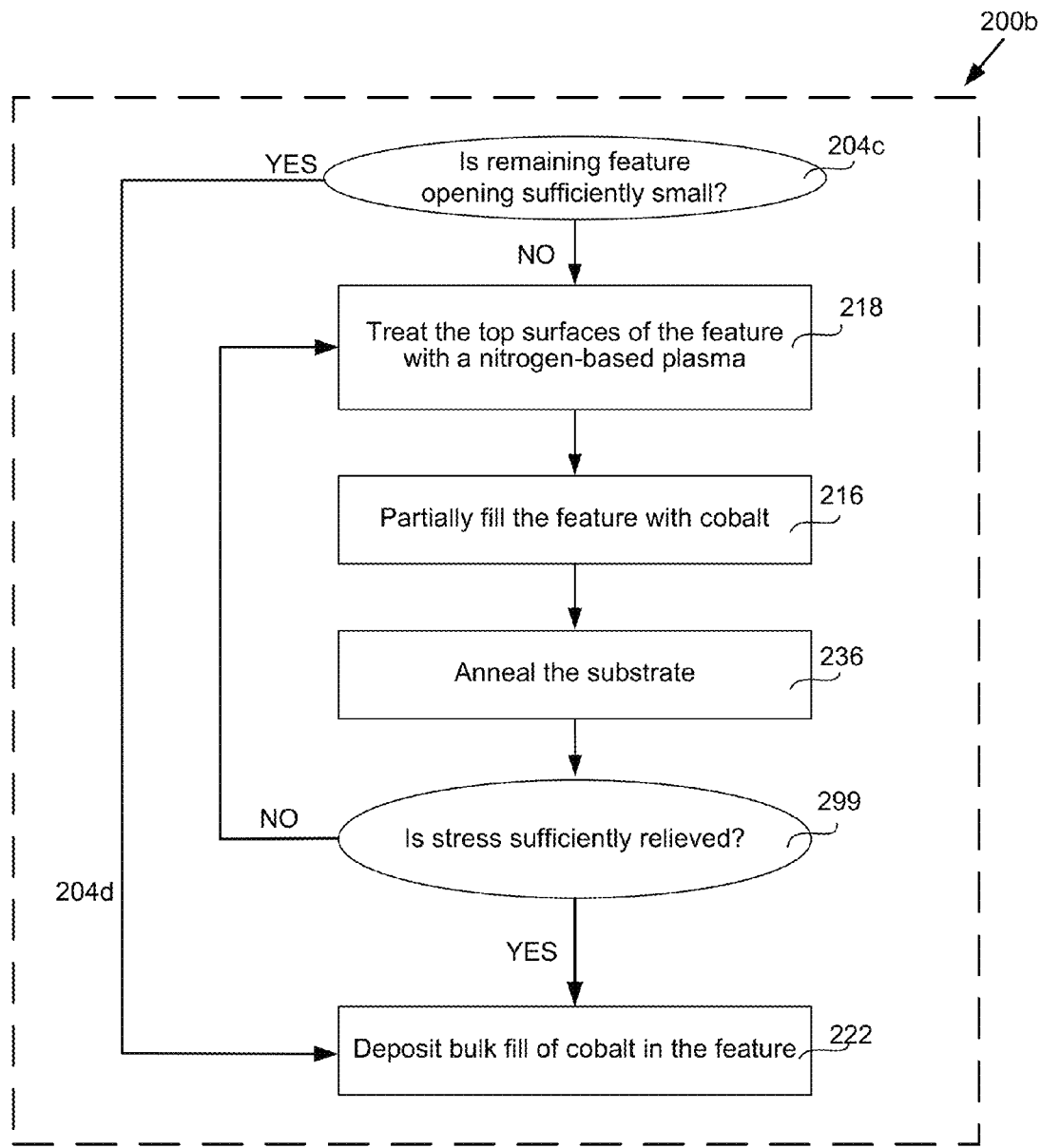
FIG. 2B is a process flow diagram depicting a method in accordance with disclosed embodiments.

As described above, in some embodiments, operations of 200b may be performed after operation 204b of FIG. 2A. As shown in FIG. 2B, in operation 204c, it is determined whether the feature opening is sufficiently small. This determination may be made as described above with respect to FIG. 2A. In some embodiments, even if the feature opening is sufficiently small, in some embodiments, operations 218, 216, 236, and 299 may still be performed.

In operation 218, the top surfaces of the feature are treated. Treatment with a nitrogen-based plasma may be performed in accordance with any of the conditions described above with respect to operation 208 of FIG. 2A. In operation 206, the feature is partially filled with cobalt. Deposition during 216 may be performed in accordance with any of the conditions and mechanisms described above with respect to operation 206 of FIG. 2A.

In operation 236, the substrate is thermally annealed. Annealing the substrate may have various advantages. In conventional deposition techniques, following filling of features with cobalt, a substrate may be subject to processing at high temperatures, such as thermal anneal after electroplating (and/or electroless plating) operations and dielectric deposition processes. Electroplating or electroless plating may result in small rough grains of cobalt on the substrate. Thus, after electroplating or electroless plating, the substrate is conventionally annealed to form larger grains of cobalt, which have lower resistivity.

However, due to martensitic phase transformation, the cobalt film may undergo various stress hystereses when heated. Martenisitic phase transformation of cobalt is further discussed in Hesemann et al., *The Effect of Film Thickness on Stress and Transformation Behavior in Cobalt Thin Films*. The difference in stress may be so high so as to cause cobalt delamination, whereby cobalt is lifted from the substrate-cobalt interface, and adhesion between cobalt and the substrate may be substantially reduced. For cobalt deposition into features, this may be of concern since a feature filled with cobalt may have no space in the feature to move or change the cobalt grain structure, thereby causing damage and/or delamination of the device structure.

Certain disclosed embodiments described herein lessen the stress by pre-stressing the film during deposition in the feature. Annealing may also reduce surface roughness and produce smoother films. For example, annealing may allow cobalt grains to coalesce, thereby reducing roughness and increasing grain size of the deposited cobalt and reducing resistivity. In various embodiments, annealing may also seal voids within features. For example, cobalt may be deposited in rough, small grains to partially fill a feature and annealing may rearrange the grains in the feature to thereby close one or more voids that may be present in the feature after partial deposition. Operation 236 of FIG. 2B may be performed when or after cobalt is partially filled in operation 216. A partial fill of cobalt may be defined as filling between about 20% and about 60% of a feature. Operation 236 of FIG. 2B may be performed when the feature is not completely filled so as to allow space in the feature for grains of cobalt to be rearranged. In some embodiments such as those described below, operation 236 may be performed in cycles. In various embodiments, annealing is performed in-situ (e.g., without an air break).

Annealing may be performed at a temperature between about 250° C. and about 500° C. In some embodiments, annealing is performed at a temperature higher than the temperature during which a feature is partially filled with cobalt. The duration of the anneal may depend on the type of heating method used to heat the substrate. Example techniques include radiation heating, laser heating, thermal heating, and electromagnetic radiation heating. In some embodiments, annealing may be performed such that the annealing time is performed as quickly as possible. In some embodiments, heating may be performed for a duration between 1 second and 30 minutes.

In operation 299 of FIG. 2B, it is determined whether the stress at the cobalt-substrate interface is sufficiently relieved. This may be determined empirically in some embodiments. During operation 299, it may also be determined whether the substrate has sufficient cobalt to prepare the substrate for subsequent electroplating and electroless operations. For example, in some embodiments, the feature may not be completely filled when the substrate undergoes bulk fill in operation 222. In operation 222, bulk cobalt is deposited into the feature to fill the feature. In some embodiments, operation 222 may involve process conditions and mechanisms described above with respect to operation 212 of FIG. 2A. In some embodiments, operation 222 may involve electroplating and electroless plating cobalt onto the substrate.

In some embodiments, operations 218, 216, and 236 are repeated in one or more cycles. In some embodiments, operations 218 and 216 are repeated and annealing the substrate in operation 236 is performed every n cycles, where n is an integer equal to or greater than 2.

Apparatus

Any suitable chamber may be used to implement disclosed embodiments. In some embodiments, a plasma may not be used during deposition of cobalt. Examples of deposition apparatuses include various systems, e.g., ALTUS and ALTUS Max, available from Lam Research Corporation of Fremont, Calif., or any of a variety of other commercially available processing systems.

Deposition techniques provided herein may also be implemented in a plasma enhanced chemical vapor deposition (PECVD) chamber or a conformal film deposition (CFD) chamber or in some embodiments, an ALD chamber. A suitable chamber may take many forms, and may be part of an apparatus that includes one or more chambers or reactors (sometimes including multiple stations) that may each house one or more substrate or wafers and may be configured to perform various substrate processing operations. The one or more chambers may maintain the substrate in a defined position or positions (with or without motion within that position, e.g., rotation, vibration, or other agitation). In one implementation, a substrate undergoing film deposition may be transferred from one station to another within a chamber during the process. In other implementations, the substrate may be transferred from chamber to chamber within the apparatus to perform different operations, such as etching operations or lithography operations. The full film deposition may occur entirely at a single station or any fraction of the total film thickness for any deposition step. While in process, each substrate may be held in place by a pedestal, substrate chuck, and/or other substrate-holding apparatus. For certain operations in which the substrate is to be heated, the apparatus may include a heater, such as a heating plate.

Figure 5A:
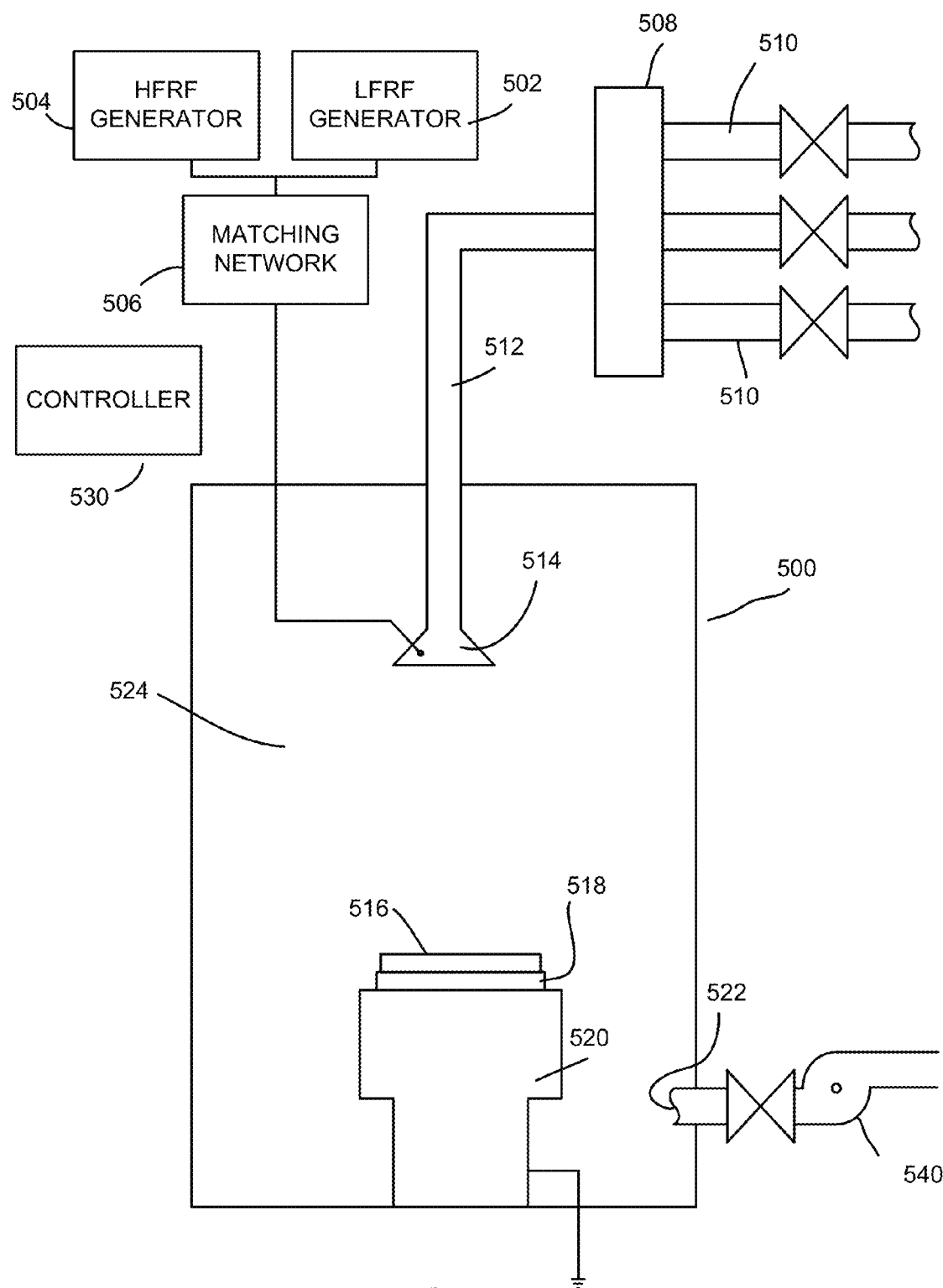
FIG. 5A is a schematic illustration of a processing chamber suitable for deposition and/or plasma treatment processes in accordance with disclosed embodiments.

FIG. 5A provides a simple block diagram depicting various reactor components arranged for implementing some methods described herein. As shown, a reactor 500 includes a process chamber 524 that encloses other components of the reactor and serves to contain a plasma generated by a capacitive-discharge type system including a showerhead 514 working in conjunction with a grounded heater block 520. A high frequency (HF) radio frequency (RF) generator 504 and a low frequency (LF) RF generator 502 may be connected to a matching network 506 and to the showerhead 514. The power and frequency supplied by matching network 506 may be sufficient to generate a plasma from process gases supplied to the process chamber 524. For example, the matching network 506 may provide 100 W to 1000 W of power. In a typical process, the HFRF component may generally be between 1 MHz to 100 MHz, e.g., 13.56 MHz. In operations where there is an LF component, the LF component may be from less than about 1 MHz, e.g., 100 kHz.

Within the reactor, a pedestal 518 may support a substrate 516. The pedestal 518 may include a chuck, a fork, or lift pins (not shown) to hold and transfer the substrate during and between the deposition and/or plasma treatment reactions. The chuck may be an electrostatic chuck, a mechanical chuck, or various other types of chuck as are available for use in the industry and/or for research.

Various process gases may be introduced via inlet 512. Multiple source gas lines 510 are connected to manifold 508. The gases may be premixed or not. Appropriate valving and mass flow control mechanisms may be employed to ensure that the correct process gases are delivered during the deposition and plasma treatment phases of the process. In the case where a chemical precursor(s) is delivered in liquid form, liquid flow control mechanisms may be employed. Such liquids may then be vaporized and mixed with process gases during transportation in a manifold heated above the vaporization point of the chemical precursor supplied in liquid form before reaching the deposition chamber.

Process gases, such as a cobalt-containing precursor or nitrogen-containing gas, may exit chamber 524 via an outlet 522. A vacuum pump, e.g., a one or two stage mechanical dry pump and/or turbomolecular pump 540, may be used to draw process gases out of the process chamber 524 and to maintain a suitably low pressure within the process chamber 524 by using a closed-loop-controlled flow restriction device, such as a throttle valve or a pendulum valve.

Figure 6:
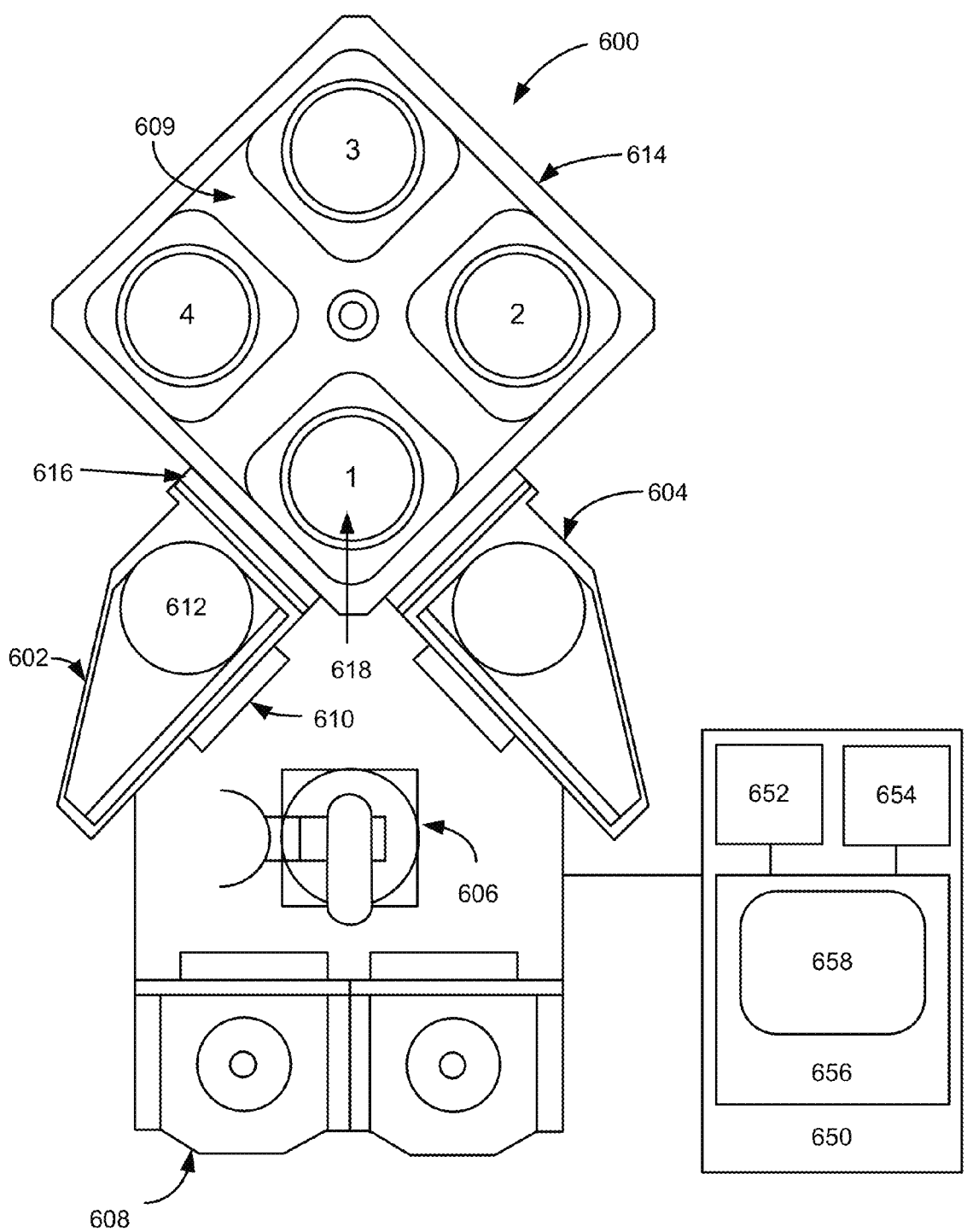
FIG. 6 is a schematic illustration of a processing apparatus suitable for deposition processes in accordance with disclosed embodiments.

As discussed above, the techniques for deposition discussed herein may be implemented on a multi-station or single station tool. FIG. 6 is a schematic illustration of an example of such a tool. In specific implementations, a 300 mm Lam Vector™ tool having a 4-station deposition scheme or a 200 mm Sequel™ tool having a 6-station deposition scheme may be used. In some implementations, tools for processing 450 mm substrates may be used. In various implementations, the substrates may be indexed after every deposition and/or post-deposition plasma treatment, or may be indexed after etching steps if the etching chambers or stations are also part of the same tool, or multiple depositions and treatments may be conducted at a single station before indexing the substrate.

In some embodiments, an apparatus may be provided that is configured to perform the techniques described herein. A suitable apparatus may include hardware for performing various process operations as well as a system controller 530 having instructions for controlling process operations in accordance with the disclosed embodiments. The system controller 530 will typically include one or more memory devices and one or more processors communicatively connected with various process control equipment, e.g., valves, RF generators, substrate handling systems, etc., and configured to execute the instructions so that the apparatus will perform a technique in accordance with the disclosed embodiments, e.g., a technique such as that provided in the deposition steps of FIG. 2A. Machine-readable media containing instructions for controlling process operations in accordance with the present disclosure may be coupled to the system controller 530. The controller 530 may be communicatively connected with various hardware devices, e.g., mass flow controllers, valves, RF generators, vacuum pumps, etc. to facilitate control of the various process parameters that are associated with the deposition operations as described herein.

In some embodiments, a system controller 530 may control all of the activities of the reactor 500. The system controller 530 may execute system control software stored in a mass storage device, loaded into a memory device, and executed on a processor. The system control software may include instructions for controlling the timing of gas flows, substrate movement, RF generator activation, etc., as well as instructions for controlling the mixture of gases, the chamber and/or station pressure, the chamber and/or station temperature, the substrate temperature, the target power levels, the RF power levels, the substrate pedestal, chuck, and/or susceptor position, and other parameters of a particular process performed by the reactor apparatus 500. For example, the software may include instructions or code for controlling the flow rate of a cobalt-containing precursor, the flow rate of a reducing agent, the flow rate of a nitrogen-containing gas, and exposure times for each of the above described flow chemistries. The system control software may be configured in any suitable way. For example, various process tool component subroutines or control objects may be written to control operation of the process tool components necessary to carry out various process tool processes. The system control software may be coded in any suitable computer readable programming language.

The system controller 530 may typically include one or more memory devices and one or more processors configured to execute the instructions so that the apparatus will perform a technique in accordance with the present disclosure. Machine-readable media containing instructions for controlling process operations in accordance with disclosed embodiments may be coupled to the system controller 530.

Figure 5B:
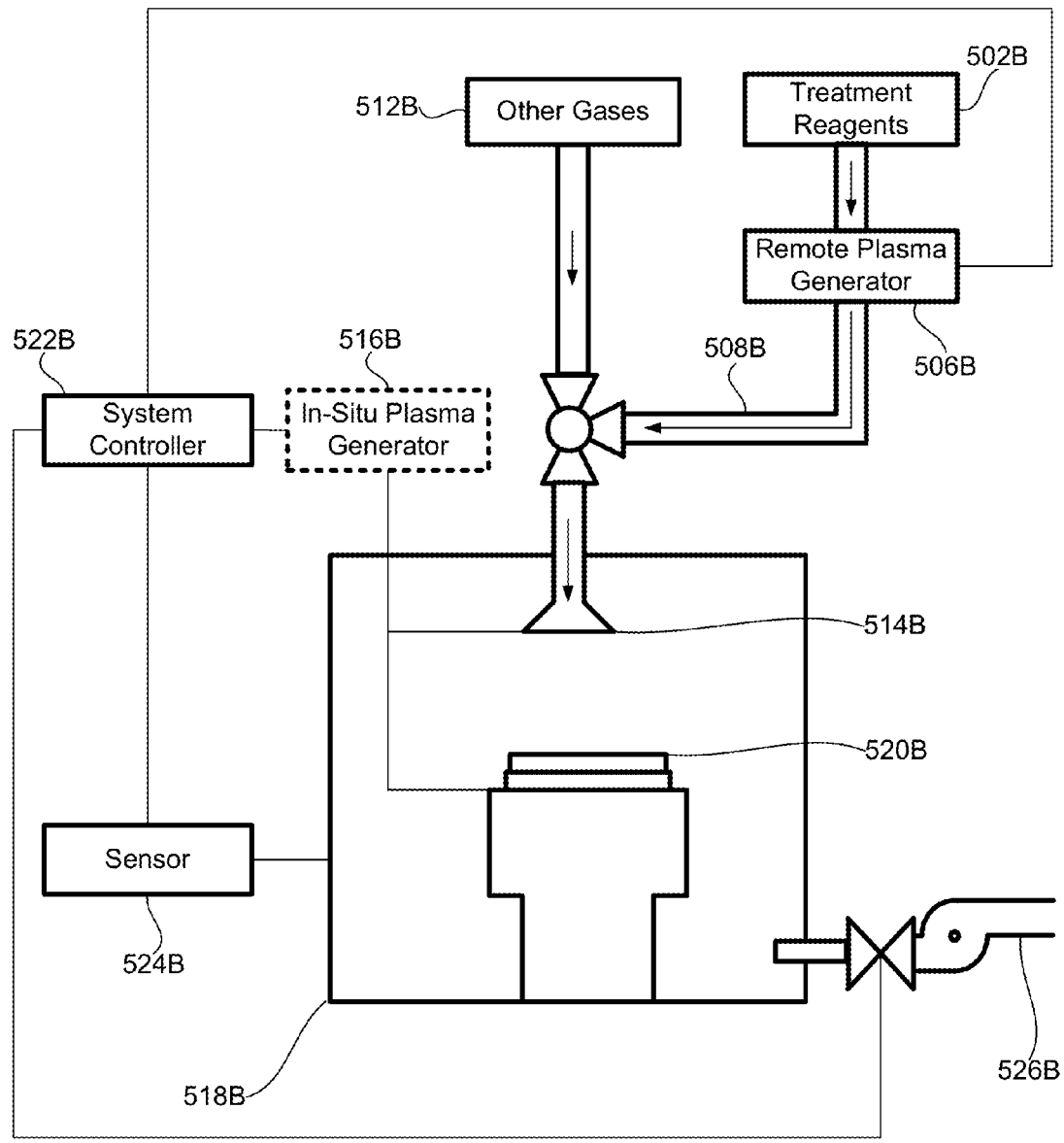
FIG. 5B is a schematic illustration of a processing chamber suitable for deposition and/or remote plasma treatment processes in accordance with disclosed embodiments.

FIG. 5B illustrates a schematic representation of an apparatus 500B for processing a semiconductor substrate in accordance with certain embodiments. The apparatus 500B includes a chamber 518B with a pedestal 520B, a shower head 514B, and an optional in-situ plasma generator 516B. The apparatus 500B also includes a system controller 522B to receive input and/or supply control signals to various devices. The apparatus also includes 512B other gases that may be delivered to the chamber via showerhead 514B.

The nitrogen-containing gas and, in certain embodiments, inert gases, such as argon, helium and others, are supplied to the remote plasma generator 506B from a source 502B, which may be a storage tank. Any suitable remote plasma generator may be used for activating the nitrogen-containing gas before introducing it into the chamber 518B. For example, a Remote Plasma Cleaning (RPC) units, such as ASTRON® i Type AX7670, ASTRON® e Type AX7680, ASTRON® ex Type AX7685, ASTRON® hf-s Type AX7645, all available from MKS Instruments of Andover, Mass., may be used. An RPC unit is typically a self-contained device generating weakly ionized plasma using the supplied nitrogen-containing gas. Imbedded into the RPC unit a high power RF generator provides energy to the electrons in the plasma. This energy is then transferred to the neutral etchant molecules leading to temperature in the order of 2000K causing thermal dissociation of these molecules. An RPC unit may dissociate more than 60% of incoming etchant molecules because of its high RF energy and special channel geometry causing the etchant to adsorb most of this energy. In various embodiments, the remote plasma generator may generate a plasma using a radio frequency (RF) plasma power between about 50 W and about 10000 W.

In certain embodiments, a nitrogen-based plasma is flown from the remote plasma generator 506B through a connecting line 508B into the chamber 518B, where the mixture is distributed through the showerhead 514B. In other embodiments, a nitrogen-based plasma is flown into the chamber 518B directly completely bypassing the remote plasma generator 506 (e.g., the system 500B does not include such generator). Alternatively, the remote plasma generator 506B may be turned off while flowing the nitrogen-based plasma into the chamber 518B, for example, because activation of the etchant is not needed.

In some embodiments, the showerhead 514B or the pedestal 520B typically may have an internal plasma generator 516B attached to it. In one example, the generator 516B is a High Frequency (HF) generator capable of providing between about 0 W and 10,000 W at frequencies between about 1 MHz and 100 MHz. In a more specific embodiment, the HF generator may deliver between about 0 W to 5,000 W at about 13.56 MHz. The RF generator 516B may generate in-situ plasma to enhance removal of the initial tungsten layer. In certain embodiments, the RF generator 516B is not used during the removal operations of the process.

The chamber 518B may include a sensor 524B for sensing various process parameters, such as degree of deposition and etching, concentrations, pressure, temperature, and others. The sensor 524B may provide information on chamber conditions during the process to the system controller 522B. Examples of the sensor 524B include mass flow controllers, pressure sensors, thermocouples, and others. The sensor 524B may also include an infra-red detector or optical detector to monitor presence of gases in the chamber and control measures.

Deposition and selective removal operations generate various volatile species that are evacuated from the chamber 518B. Moreover, processing is performed at certain predetermined pressure levels the chamber 518B. For example, in some embodiments, the chamber pressure may be set at a pressure between about 0.001 Torr and about 10 Torr. Both of these functions may be achieved using a vacuum outlet 526B, which may be a vacuum pump.

Cobalt-containing precursors, as well as treatment chemistry may enter the chamber from showerhead 514B such that a substrate on pedestal 520B is exposed to the precursor or treatment chemistry during various embodiments.

In certain embodiments, a system controller 522B may include any of the features and functions of system controller 530 described above with respect to FIG. 5A or any of the features and functions of control 650 described below with respect to FIG. 6.

As described above, one or more process stations may be included in a multi-station processing tool. FIG. 6 shows a schematic view of an embodiment of a multi-station processing tool 600 with an inbound load lock 602 and an outbound load lock 604, either or both of which may comprise a remote plasma source. A robot 606, at atmospheric pressure, is configured to move substrates from a cassette loaded through a pod 608 into inbound load lock 602 via an atmospheric port 610. A substrate is placed by the robot 606 on a pedestal 612 in the inbound load lock 602, the atmospheric port 610 is closed, and the load lock is pumped down. Where the inbound load lock 602 comprises a remote plasma source, the substrate may be exposed to a remote plasma treatment in the load lock prior to being introduced into a processing chamber 614. Further, the substrate also may be heated in the inbound load lock 602 as well, for example, to remove moisture and adsorbed gases. Next, a chamber transport port 616 to processing chamber 614 is opened, and another robot (not shown) places the substrate into the reactor on a pedestal of a first station shown in the reactor for processing. While the embodiment depicted in FIG. 6 includes load locks, it will be appreciated that, in some embodiments, direct entry of a substrate into a process station may be provided.

The depicted processing chamber 614 comprises four process stations, numbered from 1 to 4 in the embodiment shown in FIG. 6. Each station has a heated pedestal (shown at 618 for station 1), and gas line inlets. Some stations may include similar components to those described above with respect to FIG. 5A. It will be appreciated that in some embodiments, each process station may have different or multiple purposes. For example, in some embodiments, a process station may be switchable between an ALD and CVD process mode. Additionally or alternatively, in some embodiments, processing chamber 614 may include one or more matched pairs of ALD and CVD process stations. In some embodiments, features may be partially filled with cobalt thermally (e.g., without a plasma) using ALD or CVD at one station (such as station 1). The substrate may then be transferred to a second station (such as station 2) within the same chamber 614, or to a station in a different chamber, where the substrate is exposed to a nitrogen-containing gas and plasma, followed by exposure to a cobalt-containing precursor and a reducing agent to deposit bulk cobalt by CVD. In some embodiments, the reducing agent alternates with plasma exposure while a nitrogen-containing gas flows into the chamber. The nitrogen-containing gas and/or the reducing agent may be introduced only to the station where the substrate of interest is (such as station 2), or it may be introduced to the entire chamber 614.

In various embodiments, the substrate is not transferred to a second station. Rather, the substrate remains in the same station as during the thermal deposition (e.g., station 1), but the station is equipped to also introduce a reducing agent, a nitrogen-containing gas, and plasma to the station after the thermal deposition.

In some embodiments, after the substrate undergoes thermal deposition of cobalt, the substrate is transferred to a different chamber, which may also include various stations. While the depicted processing chamber 614 comprises four stations, it will be understood that a processing chamber according to the present disclosure may have any suitable number of stations. For example, in some embodiments, a processing chamber may have five or more stations, while in other embodiments a processing chamber may have three or fewer stations.

FIG. 6 depicts an embodiment of a wafer handling system 609 for transferring wafers within processing chamber 614. In some embodiments, wafer handling system 609 may transfer wafers between various process stations and/or between a process station and a load lock. It will be appreciated that any suitable wafer handling system may be employed. Non-limiting examples include wafer carousels and wafer handling robots. FIG. 6 also depicts an embodiment of a system controller 650 employed to control process conditions and hardware states of process tool 600. System controller 650 may include one or more memory devices 656, one or more mass storage devices 654, and one or more processors 652. Processor 652 may include a CPU or computer, analog, and/or digital input/output connections, stepper motor controller boards, etc.

In some embodiments, the controller 650 controls all of the activities of process tool 600. The controller 650 executes system control software 658 stored in mass storage device 654, loaded into memory device 656, and executed on processor 652. Alternatively, the control logic may be hard coded in the controller 650. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 658 may include instructions for controlling the timing, mixture of gases, amount of sub-saturated gas flow, chamber and/or station pressure, chamber and/or station temperature, wafer temperature, target power levels, RF power levels, substrate pedestal, chuck and/or susceptor position, and other parameters of a particular process performed by process tool 600. System control software 658 may be configured in any suitable way. For example, various process tool component subroutines or control objects may be written to control operation of the process tool components necessary to carry out various process tool processes. System control software 658 may be coded in any suitable computer readable programming language.

In some embodiments, system control software 658 may include input/output control (IOC) sequencing instructions for controlling the various parameters described above. Other computer software and/or programs stored on mass storage device 654 and/or memory device 656 associated with the controller 650 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 618 and to control the spacing between the substrate and other parts of process tool 600.

A process gas control program may include code for controlling gas composition (e.g., cobalt-containing precursor, reducing agent, and nitrogen-containing gas as described herein) and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

In some implementations, a controller 650 is part of a system, which may be part of the above-described examples. Such systems can comprise semiconductor processing equipment, including a processing tool or tools, chamber or chambers such as chamber 614, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller 650, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller 650 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller 650 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer. For example, parameters may include cobalt-containing precursor gas flow, reducing agent gas flow, carrier gas flow, nitrogen-containing gas flow, plasma power and frequency, pedestal temperature, station or chamber pressure and/or temperature, and others.

The controller 650, in some implementations, may be a part of or coupled to a computer that is integrated with, coupled to the system, otherwise networked to the system, or a combination thereof. For example, the controller 650 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller 650 receives instructions in the form of data, which specify parameters for each of the processing steps to be performed during one or more operations. It should be understood that the parameters may be specific to the type of process to be performed and the type of tool that the controller 650 is configured to interface with or control. Thus as described above, the controller 650 may be distributed, such as by comprising one or more discrete controllers that are networked together and working towards a common purpose, such as the processes and controls described herein. An example of a distributed controller 650 for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller 650 might communicate with one or more of other tool circuits or modules, other tool components, cluster tools such as tool 600, other tool interfaces, adjacent tools, neighboring tools, tools located throughout a factory, a main computer, another controller 650, or tools used in material transport that bring containers of wafers to and from tool locations and/or load ports in a semiconductor manufacturing factory.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations in accordance with the embodiments herein.

A pressure control program may include code for maintaining the pressure in the reaction chamber in accordance with the embodiments herein.

In some embodiments, there may be a user interface associated with the controller 650. The user interface may include a display screen, graphical software displays of the apparatus and/or process conditions, and user input devices such as pointing devices, keyboards, touch screens, microphones, etc.

In some embodiments, parameters adjusted by the controller 650 may relate to process conditions. Non-limiting examples include process gas composition and flow rates, temperature, pressure, plasma conditions (such as RF bias power levels), pressure, temperature, etc. These parameters may be provided to the user in the form of a recipe, which may be entered utilizing the user interface.

Signals for monitoring the process may be provided by analog and/or digital input connections of the controller 650 from various process tool sensors. The signals for controlling the process may be output on the analog and digital output connections of process tool 600. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

The controller 650 may provide program instructions for implementing the above-described deposition processes. The program instructions may control a variety of process parameters, such as DC power level, RF bias power level, pressure, temperature, etc. The instructions may control the parameters to operate in-situ deposition of film stacks according to various embodiments described herein.

The controller will typically include one or more memory devices and one or more processors configured to execute the instructions so that the apparatus will perform a method in accordance with the present embodiments. Machine-readable media containing instructions for controlling process operations in accordance with the present embodiments may be coupled to the controller.

An appropriate apparatus for performing the methods disclosed herein is further discussed and described in U.S. patent application Ser. No. 13/084,399 (now U.S. Pat. No. 8,728,956), filed Apr. 11, 2011, and titled "PLASMA ACTIVATED CONFORMAL FILM DEPOSITION"; and Ser. No. 13/084,305, filed Apr. 11, 2011, and titled "SILICON NITRIDE FILMS AND METHODS," each of which is incorporated herein in its entireties.

The apparatus/process described herein may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

EXPERIMENTAL

Experiment 1

An experiment was conducted to compare nucleation delays for treated and untreated cobalt films. Blanket cobalt seed layers were deposited on two substrates. On one substrate, the surfaces were treated at a temperature of 80° C. to nitrogen and plasma for 20 seconds. The other substrate was not treated. Both substrates were then exposed to a cobalt-containing precursor and hydrogen in a cobalt CVD bulk deposition. The amount of cobalt formed on the cobalt seed layer was measured over time.

Figure 7:
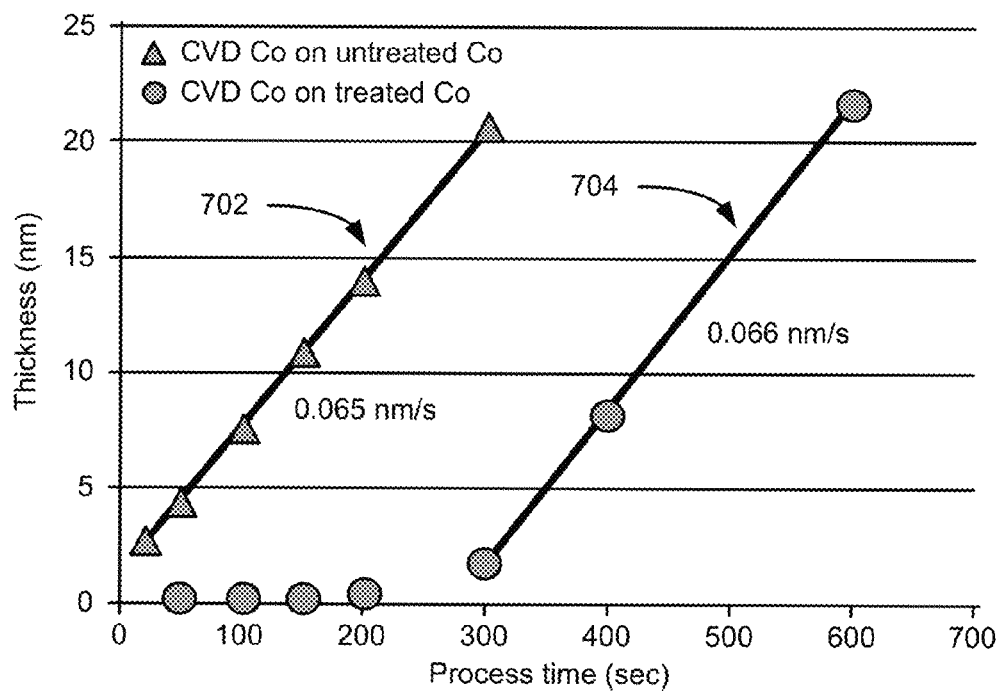
FIGS. 7 and 8 are plots depicting experimental results from depositing cobalt in accordance with disclosed embodiments.

FIG. 7 is a plot showing the various thicknesses of cobalt as deposited over time. Triangular plots 702 represent thicknesses measured for the untreated cobalt seed layer. Note the triangular plots show little to no nucleation delay. The circular plots 704 represent thicknesses measured for the treated cobalt seed layer. The nucleation delay was over about 200 seconds. Note that after the cobalt nucleates the deposition rate for both the untreated and treated substrates were similar (0.065 nm/s for untreated cobalt, and 0.066 nm/s for treated cobalt). These results suggest exposing a cobalt film to nitrogen and plasma may increase nucleation delay such that features may be filled with cobalt by delaying nucleation at or near the top of the feature to reduce voids.

Experiment 2

Figure 8:
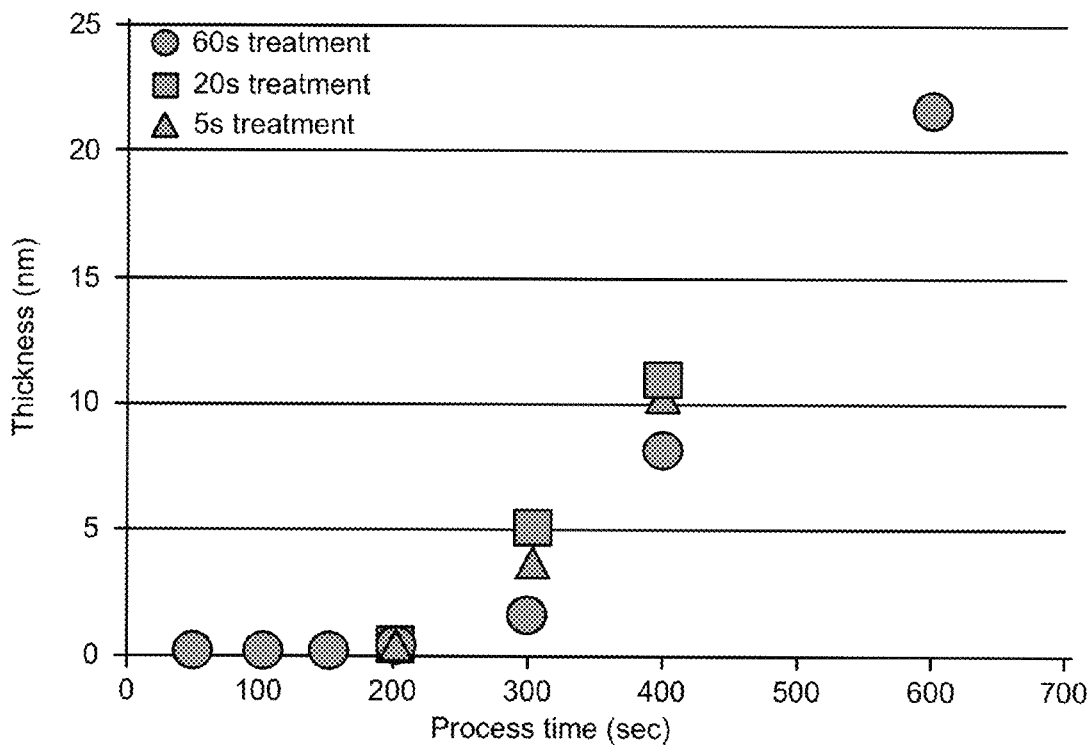

An experiment was conducted to compare the treatment exposure times on cobalt films. Three trials were performed, each on a blanket layer of cobalt film deposited in accordance with the methods described above in operation 202 of FIG. 2A. The cobalt was exposed to nitrogen and plasma for 5 seconds, 20 seconds, and 60 seconds, each at 80° C. The substrates were subsequently exposed to a cobalt-containing precursor and hydrogen to deposit a bulk cobalt layer by CVD. Thicknesses of the newly deposited cobalt on the treated surfaces were measured and the results are plotted in FIG. 8. The thickness of cobalt deposited after a 5-second treatment is shown with triangular plots, 20-second treatment with square plots, and 60-second treatment with circular plots.

As shown, the treated films saturate at around 5 seconds, which indicates that the treatment effectively generates the treated surface (e.g., cobalt nitride surface) that may be used to retard the cobalt film nucleation at a short time.

Experiment 3

Figure 9A:
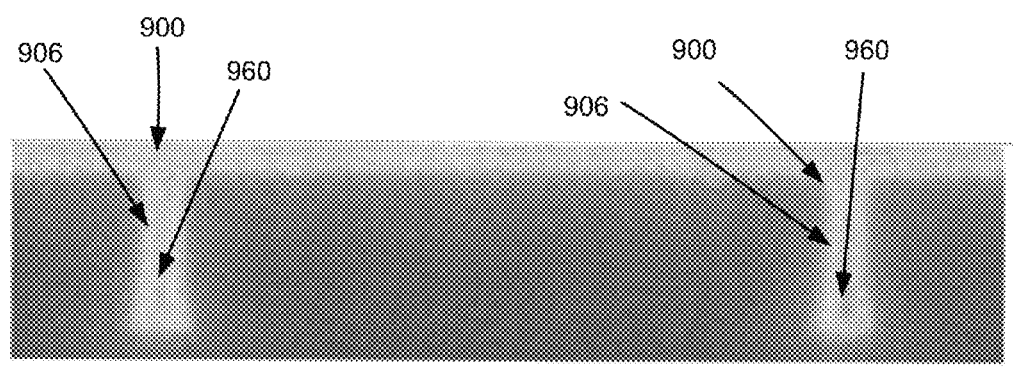
FIG. 9A is a SEM image of features filled with cobalt.
Figure 9B:
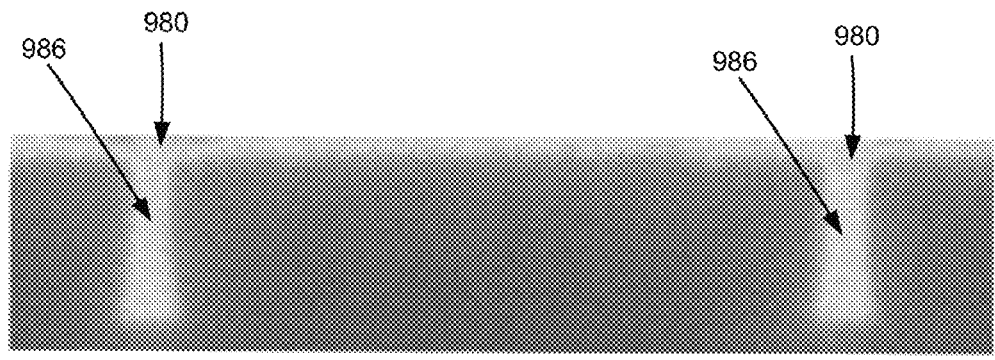
FIG. 9B is a SEM image of features filled with cobalt in accordance with disclosed embodiments.

An experiment was conducted to compare features deposited with cobalt using methods described herein. Each substrate included features with re-entrant features. One substrate was deposited using the method described above with respect to FIG. 2A. The second substrate was deposited with cobalt without treatment—the cobalt seed layer was first deposited, followed by CVD bulk fill of cobalt. SEM images of the deposited films are shown in FIGS. 9A and 9B. FIG. 9A shows features deposited without the treatment. Note features 900 included deposited cobalt 906, but a void 960 formed in both features. FIG. 9B shows features deposited with the treatment. The features 980 are filled with cobalt 986 with no voids.

Experiment 4

Figure 10A:
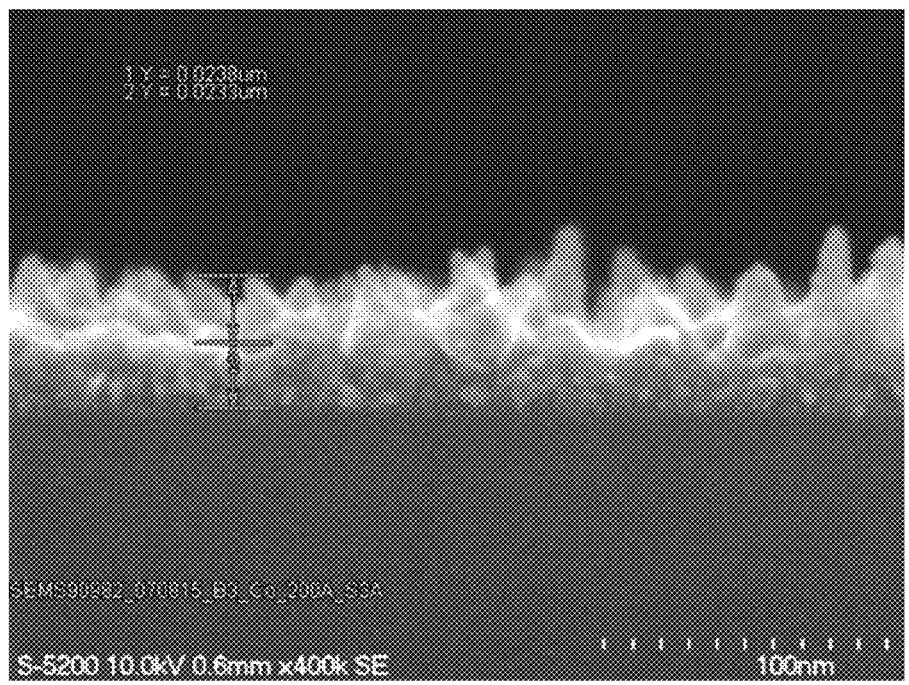
FIG. 10A is an image of a blanket cobalt film on a substrate.
Figure 10B:
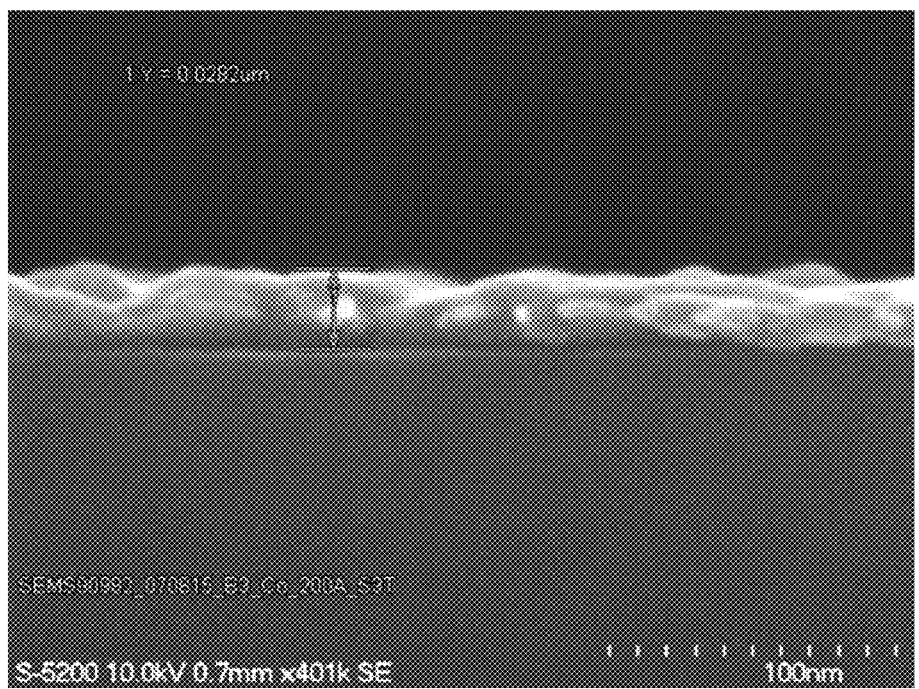
FIG. 10B is an image of a blanket cobalt film on a substrate in accordance with certain embodiments.

An experiment was conducted to compare roughness of cobalt films deposited using methods described herein. A substrate with 200 Å of cobalt deposited by CVD is shown in FIG. 10A. The substrate was annealed thermally at 400° C. in a hydrogen/helium ($H_2$/He) (50%) environment for 10 minutes. FIG. 10B shows the blanket cobalt layer after annealing, which has substantially lower surface roughness than the substrate in FIG. 10A.

Figure 10C:
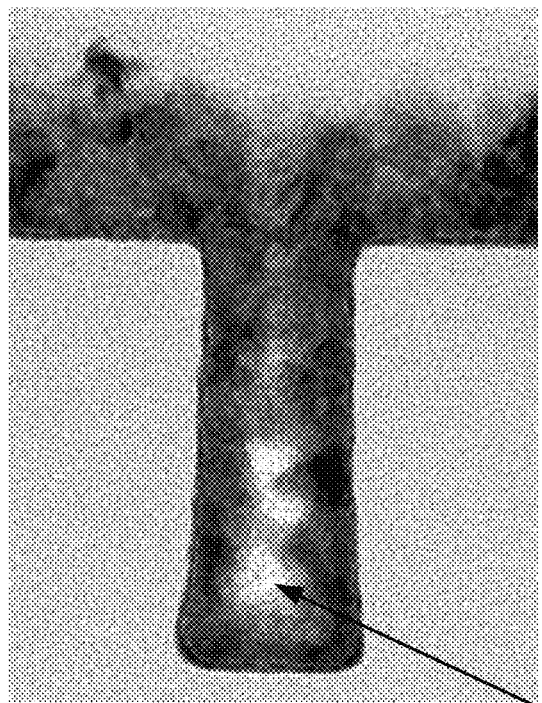
FIG. 10C is an image of a cobalt film deposited in a feature on a substrate.
Figure 10D:
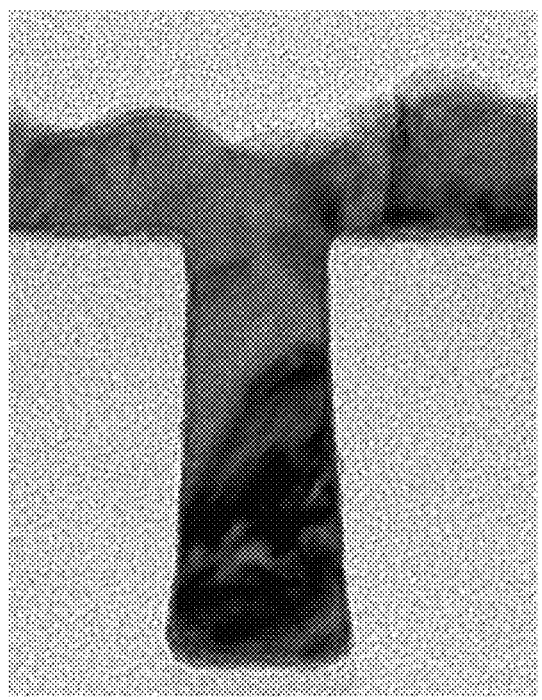
FIG. 10D is an image of a cobalt film deposited in a feature on a substrate in accordance with certain embodiments.

Cobalt was deposited by CVD into features of a substrate. FIG. 10C shows a feature partially filled (e.g., not completely filled) with cobalt deposited by CVD. Note the roughness of the deposited cobalt results in a void 1001 in the feature. The substrate was annealed thermally at 400° C. in a hydrogen/helium ($H_2$/He) (50%) environment for 10 minutes. FIG. 10D shows the feature with cobalt after annealing. As shown, surface roughness and grain structure is significantly improved, with larger grains and no voids in the feature, with smoother films.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method of processing a semiconductor substrates, the method comprising:
    (a) providing a substrate having one or more features, each feature comprising a feature opening;
    (b) selectively inhibiting cobalt nucleation on surfaces of the one or more features that are at or near the feature openings such that there is a differential inhibition profile in each feature; and
    (c) exposing the substrate to a cobalt-containing precursor to partially fill the one or more features,
    wherein selectively inhibiting cobalt nucleation further comprises exposing the substrate to plasma generated from a nitrogen-containing gas in a remote plasma source.

2. The method of claim 1, further comprising depositing cobalt in the one or more features in accordance with the differential inhibition profile.

3. The method of claim 1, further comprising repeating (b) and (c) in two or more cycles to deposit cobalt into the one or more features.

4. The method of claim 1, further comprising annealing the substrate after partially filling the one or more features.

5. The method of claim 3, further comprising annealing the substrate after partially filling the one or more features, wherein the substrate is annealed after each of the two or more cycles.

6. The method of claim 4, wherein the annealing is performed when an amount of cobalt deposited in at least one of the one or more features is between about 20% and about 60% of the at least one of the one or more features.

7. The method of claim 4, further comprising after annealing the substrate, electroplating copper or performing electroless plating of copper onto the substrate.

8. The method of claim 2, wherein the cobalt is deposited by chemical vapor deposition, atomic layer deposition, or a combination thereof.

9. The method of claim 2, wherein the cobalt is deposited by electroplating or electroless plating.

10. The method of claim 4, wherein the substrate is annealed at a temperature between about 250° C. and about 500° C.

11. The method of claim 1, further comprising prior to selectively inhibiting cobalt nucleation, depositing a barrier layer on the one or more features.

12. The method of claim 11, wherein the barrier layer is selected from the group consisting of titanium, titanium nitride, tungsten, tungsten-containing materials, tungsten nitride, tantalum, tantalum nitride, ruthenium, and cobalt nitride.

13. The method of claim 1, wherein (b) and (c) are performed at a temperature less than about 400° C.

14. The method of claim 1, wherein the cobalt-containing precursor is selected from the group consisting of dicarbonyl cyclopentadienyl cobalt, cobalt carbonyl, various cobalt amidinate precursors, cobalt diazadienyl complexes, cobalt amidinate/guanidinate precursors, and combinations thereof.

15. The method of claim 1, wherein the surfaces of the one or more features that are at or near the feature openings comprise the top about 10% to about 50% of sidewalls of the one or more features.

16. The method of claim 1, wherein the one or more features comprise re-entrant profiles.

17. The method of claim 1, wherein depositing cobalt in (c) comprises exposing the substrate to the cobalt-containing precursor and a reducing agent.

18. The method of claim 1, wherein feature openings of the one or more features is less than about 69 nm and aspect ratios of the one or more features is between about 5:1 and about 100:1.

* * * * *